(12) United States Patent
Zhuo et al.

(10) Patent No.: US 11,018,660 B2
(45) Date of Patent: May 25, 2021

(54) MULTI-MODE FEEDBACK CONTROL THROUGH DIGITAL ISOLATOR

(71) Applicant: Analog Devices Global Unlimited Company, Hamilton (BM)

(72) Inventors: Yue Zhuo, Beijing (CN); Wenhui Qin, Shanghai (CN); Yingjie Guo, Beijing (CN); Shaoyu Ma, Shanghai (CN); Tianting Zhao, Beijing (CN); Baoxing Chen, Westford, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/125,620

(22) Filed: Sep. 7, 2018

(65) Prior Publication Data
US 2020/0083874 A1  Mar. 12, 2020

(51) Int. Cl.
*H02M 1/092* (2006.01)
*H03K 7/08* (2006.01)
(Continued)

(52) U.S. Cl.
CPC ............ *H03K 7/08* (2013.01); *H02M 1/0845* (2013.01); *H02M 1/092* (2013.01); *H02M 2001/0003* (2013.01); *H02M 2001/0041* (2013.01)

(58) Field of Classification Search
CPC .................. H03K 7/08; H02M 1/0845; H02M 2001/0041; H02M 2001/0003; H02M 1/092
See application file for complete search history.

(56) References Cited

U.S. PATENT DOCUMENTS 6,980,039 B1   12/2005  Dening et al.
7,302,247 B2   11/2007  Dupuis
(Continued)

FOREIGN PATENT DOCUMENTS

EP  2 151 906 A2   2/2010
EP  2 400 631 A1   12/2011
(Continued)

OTHER PUBLICATIONS

"Integrated signal and power isolation provides robust and compact measurement and control", EDN article, URL:https://www.edn.com/integrated-signal-and-power-isolation-provides-robust-and-compact-measurement-and-control/ (Year: 2013).*
(Continued)

*Primary Examiner* — Matthew V Nguyen
*Assistant Examiner* — Jye-June Lee
(74) *Attorney, Agent, or Firm* — Wolf, Greenfield & Sacks, P.C.

(57) ABSTRACT

Power isolators with multiple selectable feedback modes are described. The power isolators may transfer a power signal from a primary side to a second side. A feedback signal may be provided from the secondary side to the primary side to control generation of the power signal on the primary side. In this manner, the power signal provided to the secondary side may be maintained within desired levels. The feedback signal may be generated by feedback circuitry configurable to operate in different modes, such that the feedback signal may be of differing types depending on which feedback mode is implemented.

20 Claims, 13 Drawing Sheets

(51) Int. Cl.
*H02M 1/084* (2006.01)
*H02M 1/00* (2006.01)

(56) References Cited

U.S. PATENT DOCUMENTS

| | | | |
|---|---|---|---|
| 7,577,223 B2 | 8/2009 | Alfano et al. | |
| 7,701,731 B2* | 4/2010 | Dhuyvetter | H03K 7/08 |
| | | | 363/16 |
| 8,502,584 B1 | 8/2013 | Dong et al. | |
| 8,736,343 B2 | 5/2014 | Chen et al. | |
| 10,193,457 B1* | 1/2019 | Hande | H02M 1/08 |
| 2003/0174005 A1 | 9/2003 | Latham, II et al. | |
| 2006/0120115 A1 | 6/2006 | Chen et al. | |
| 2007/0003055 A1 | 1/2007 | Bark et al. | |
| 2007/0171055 A1 | 7/2007 | Laakso et al. | |
| 2008/0192509 A1 | 8/2008 | Dhuyvetter et al. | |
| 2008/0311862 A1 | 12/2008 | Spina et al. | |
| 2009/0168462 A1 | 7/2009 | Schopfer et al. | |
| 2009/0206960 A1 | 8/2009 | Ng et al. | |
| 2009/0212759 A1 | 8/2009 | Melanson | |
| 2010/0219802 A1* | 9/2010 | Lin | H02M 3/33507 |
| | | | 323/284 |
| 2012/0099345 A1 | 4/2012 | Zhao et al. | |
| 2012/0112723 A1 | 5/2012 | He et al. | |
| 2012/0153964 A1 | 6/2012 | Chen et al. | |
| 2013/0033902 A1* | 2/2013 | Zhang | H02M 3/33523 |
| | | | 363/15 |
| 2013/0155728 A1 | 6/2013 | Melanson et al. | |
| 2013/0249479 A1 | 9/2013 | Partovi | |
| 2013/0264961 A1* | 10/2013 | Chang | H05B 45/37 |
| | | | 315/201 |
| 2013/0278438 A1 | 10/2013 | Mueck | |
| 2013/0294118 A1* | 11/2013 | So | H02M 3/33507 |
| | | | 363/21.16 |
| 2014/0169038 A1 | 6/2014 | Kamath et al. | |
| 2014/0268917 A1* | 9/2014 | Ma | H02M 3/33523 |
| | | | 363/21.15 |
| 2014/0270122 A1 | 9/2014 | Lau et al. | |
| 2016/0080182 A1 | 3/2016 | Yun et al. | |
| 2016/0087780 A1 | 3/2016 | Goswami et al. | |
| 2018/0109246 A1 | 4/2018 | Zaplana | |
| 2018/0205319 A1 | 7/2018 | Zhuo et al. | |

FOREIGN PATENT DOCUMENTS

| | | |
|---|---|---|
| WO | WO 2004/100473 A2 | 11/2004 |
| WO | WO 2009/108603 A1 | 9/2009 |

OTHER PUBLICATIONS

"Integrated Signal and Power Isolation Provide Robust and Compact Measurement and Control," MS-2511, Technical Article, Analog Devices, Inc., 2013 (Year: 2013).*

International Search Report and Written Opinion dated Mar. 14, 2018 in connection with International Application No. PCT/IB2017/001412.

* cited by examiner

MULTI-MODE FEEDBACK CONTROL THROUGH DIGITAL ISOLATOR

FIELD OF THE DISCLOSURE

Aspects of the present application relate to integrated circuit power isolators.

BACKGROUND

Integrated circuit power isolators conventionally employ a single mode of feedback. Some such power isolators employ pulse width modulation (PWM) feedback. Some such power isolators employ burst mode feedback, particularly in light power applications.

SUMMARY OF THE DISCLOSURE

Power isolators with multiple selectable feedback modes are described. The power isolators may transfer a power signal from a primary side to a second side. A feedback signal may be provided from the secondary side to the primary side to control generation of the power signal on the primary side. In this manner, the power signal provided to the secondary side may be maintained within desired levels. The feedback signal may be generated by feedback circuitry configurable to operate in different modes, such that the feedback signal may be of differing types depending on which feedback mode is implemented.

In some embodiments, an integrated multi-mode power isolator is provided, that comprises an integrated circuit substrate, a driver circuit on the integrated circuit substrate, a receiver circuit on the integrated circuit substrate, a power transfer isolator configured to isolate the driver circuit from the receiving circuit and configured to transfer a power signal from the driving circuit to the receiving circuit, a digital feedback isolator coupling an output of the receiving circuit with an input of the driving circuit and configured to transfer a power control feedback signal from the receiving circuit to the driving circuit, and a feedback control circuit configured to detect an operating condition and select a feedback control mode from a plurality of selectable feedback control modes.

In some embodiments, an integrated multiple-feedback-mode power isolator is provided, that comprises a transmitter, receiver, and power transfer isolator separating the transmitter and receiver, wherein the transmitter is configured to transmit a power signal to the receiver across the power transfer isolator, a digital feedback isolator integrated with the power transfer isolator, and a feedback control circuit configured to detect an operating condition of the multiple-feedback-mode power isolator, select a feedback control mode from among a plurality of feedback control modes, and transfer a power control feedback signal corresponding to the selected feedback control mode across the digital feedback isolator.

In some embodiments, an integrated power isolator with multi-modal feedback control is provided, that comprises a power transfer isolator, a feedback control isolator and means for providing multiple types of feedback control across the feedback control isolator.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Aspects of the present application relate to isolator systems which provide a power signal from a first circuit to a second circuit electrically isolated from the first circuit, while also providing a power feedback control signal from the second circuit to the first circuit in one of multiple possible feedback modes of operation. The two electrically isolated circuits may be isolated for a variety of reasons, such as that they may operate at different voltages or they may have different electrical reference potentials. The first circuit may transfer the power signal to the second circuit, and the second circuit may provide the power control feedback signals back to the first circuit indicating whether the power signal received by the second circuit compares favorably to a target power level. The manner of providing the feedback signal may be selected from among multiple possible feedback modes. The feedback modes may have different benefits and drawbacks, depending on the operating conditions of the system. For instance, some feedback operating modes may be more efficient, or may consume lower power, than other operating modes depending on the operating conditions of the system. By providing the capability to select, and switch between, different feedback operating modes the device operation may be improved compared to if the device was limited to implementing a single feedback operating mode in all operating conditions.

Figure 1:
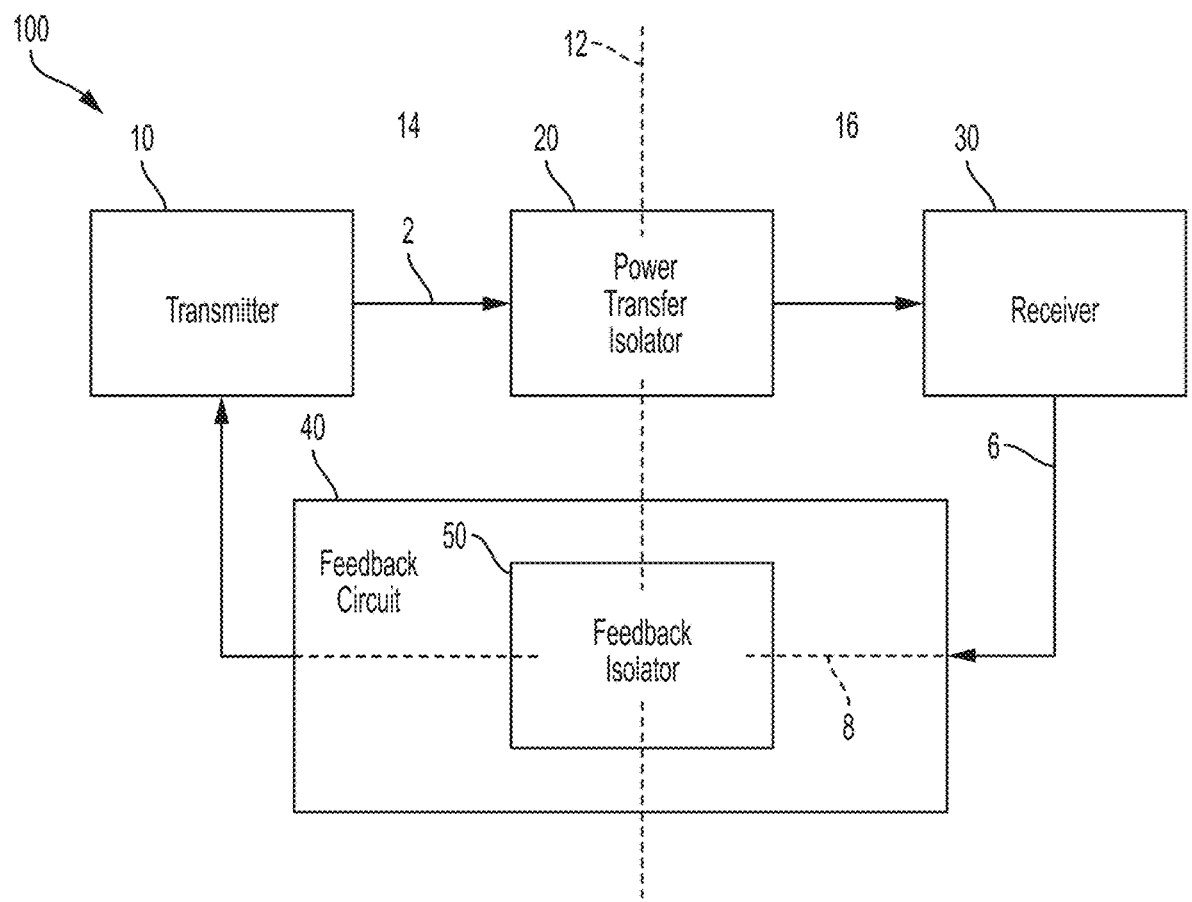
FIG. 1 is a block diagram of a multi-mode power isolator having multi-mode feedback control, according to an aspect of the present application.

FIG. 1 is a high level block diagram of a multi-mode power isolator system 100 having multi-mode feedback control. The multi-mode power isolator system 100 comprises a primary side 14 and a secondary side 16 separated by an isolation barrier 12. A transmitter 10 may be disposed on the primary side 14, and a receiver 30 on the secondary side 16. Power may be transferred from the transmitter 10 to the receiver 30 via a power transfer isolator 20. The multi-mode power isolator system 100 may further comprise a feedback circuit 40 configured to generate and transfer a feedback control signal from the secondary side 16 to the primary side 14 via a digital feedback isolator 50. In FIG. 1, the feedback circuit 40 is located on both the primary side 14 and the secondary side 16, meaning that in the non-limiting embodiment shown there may be components of the feedback circuitry 40 positioned on both sides of the feedback isolator 50. However, according to alternative embodiments, components of the feedback circuit 40 may be located entirely on the secondary side 16.

The transmitter 10 may be any suitable transmitter circuit for generating and driving a power signal 2, as the various aspects described herein are not limited in this respect. Because the transmitter 10 generates and provides the power signal 2, it may also be referred to as a power stage. In some embodiments, the transmitter 10 may comprise an LLC driver circuit and resonant components, although various aspects of the application are not limited to use with such a transmitter.

The power transfer isolator 20 may be a transformer-based or capacitor-based isolator. The isolation barrier 12 may be formed of a dielectric in at least some embodiments. In some embodiments, the power transfer isolator 20 may be a power transformer, and thus may comprise a primary winding (or coil) electromagnetically coupled to a secondary winding (or coil), with a dielectric between the windings. The windings may take any suitable shape, and be of any suitable size. In some embodiments, the windings may be microfabricated planar windings.

The receiver 30 may comprise circuitry to be powered, such as a load, as well as circuitry for receiving and conditioning the power signal 2. In some embodiments, the receiver 30 may comprise a rectifier, which may be any suitable rectifier. In some embodiments, the receiver may comprise sensing circuitry for generating an output signal 6 based on the power signal 2.

The feedback circuit 40 may comprise various components for generating a feedback control signal 8—also referred to herein as a power control feedback signal, or simply a power feedback signal—for controlling generation of the power signal 2 by the transmitter 10. In FIG. 1, a portion of the feedback control signal 8 is illustrated as a dotted line to show its propagation within the feedback circuit 40 and across the feedback isolator 50. A second portion of the feedback control signal 8 is illustrated as a solid line to show its propagation between the feedback circuit 40 and the transmitter 10. In some embodiments, as shown, the feedback circuit 40 may generate the feedback control signal 8 based on the output signal 6. The feedback circuit 40 may comprise circuitry for transferring the feedback control signal 8 from the secondary side 14 to the primary side 16 via the feedback isolator 50. In some embodiments, the feedback circuit 40 may comprise an error amplifier, a Pulse-Width Modulation (PWM) controller, a voltage controlled oscillator (VCO) and/or other suitable means for generating the feedback control signal 8 based on the output signal 6. It should be appreciated that alternative circuit components may be included. The feedback circuit 40 may further comprise transmit components on the secondary side 16 for transferring the feedback control signal 8 through the feedback isolator 50, as well as receive components on the primary side 14 for receiving the feedback control signal 8 from the feedback isolator 50. In some embodiments, the transmit components may comprise an amplifier. In some embodiments, the receive components may comprise a filter, a phase locked loop and/or an operating mode controller configured to select between possible modes of operation for the feedback circuit 40. According to various embodiments, each of the PWM controller and/or VCO may be located on the primary side 14 or the secondary side 16 of the isolation barrier 12. Components of the feedback circuit 40 on either the primary side 14 or secondary side 16 may be entirely analog, entirely digital, or a combination of analog and digital.

The feedback isolator 50 may be a transformer-based or capacitor-based digital isolator configured to transmit the feedback control signal 8 across the isolation barrier 12. In some embodiments, the feedback isolator 50 may be a transformer comprising primary and secondary windings separated by the isolation barrier 12.

During operation of the multi-mode power isolator system 100, the transmitter 10 may generate and provide the power signal 2 to the power transfer isolator 20. For example, in those embodiments in which the power transfer isolator 20 is a transformer, the transmitter 10 may generate and provide the power signal 2 to the primary winding of the transformer. The power signal 2 may cross the isolation barrier 12 via the power transfer isolator 20 and may be received by the receiver 30, which may condition the power signal 2 and provide it to a load. The power signal 2 may be sensed by sensing circuitry at the receiver 30 and used to provide the output signal 6 to the feedback circuit 40. The output signal 6 may be a proportional representation of the power signal 2. In some instances, the power signal 2 may be operating below a target threshold voltage and/or current level, and the feedback circuit 40 may be configured to generate the feedback control signal 8 accordingly. In some embodiments, the output signal 6 may be a feedback voltage proportionally representative of the power signal 2 which may be compared to a reference voltage (e.g. proportionally representative of the target threshold voltage) using an error amplifier or a comparator in the feedback circuit 40, resulting in an error voltage. The error voltage may be used by a PWM controller and/or VCO in the feedback circuit 40 to create the corresponding feedback control signal 8. The feedback control signal 8 may be transferred from the secondary side 16 across the isolation barrier 12 via the feedback isolator 50 to the primary side 14. The feedback control signal 8 may then be applied to the transmitter 10, such that the power signal 2 may be correctively adjusted to meet the target threshold voltage and/or current level. For example, a switch in the transmitter 10 may control a voltage and/or current of the power signal 2, and the feedback control signal 8 may modify behavior of the switch to impact the voltage and/or current of the power signal 2. In this example, the feedback control signal 8 may be a PWM signal, and the feedback circuit 40 may adjust a duty cycle of the feedback control signal 8 in response to the error voltage. The adjusted duty cycle of the feedback control signal 8 applied to the switch may cause the voltage and/or current of the power signal 2 to reach the target threshold voltage and/or current level. Thus, the multi-mode power isolator system 100 may utilize the feedback circuit 40 to regulate power delivery from the transmitter 10 to the receiver 30.

In some embodiments, the feedback circuit 40 may further modify the feedback control signal 8 for applying to the transmitter 10 once received at the primary side 14. For example, the feedback control signal 8, as received at the primary side 14, may operate at a low frequency. A phase locked loop or other suitable circuitry may be used to boost the feedback control signal 8 to a higher operating frequency. The feedback control signal 8 may then be passed to the transmitter 10 where it may alter generation of the power signal 2.

In some embodiments, the feedback circuit 40 may employ various operating modes and thus provide a feedback control signal of various types. For example, the feedback circuit 40 may operate in any of the following operating modes: PWM mode, in which the feedback control signal 8 is a PWM signal; burst mode, in which the feedback control signal is a burst-PWM signal; Pulse Frequency Modulation (PFM) mode, in which the feedback control signal is a PFM signal; or Frequency Modulation (FM) mode, in which the feedback control signal is an FM signal. Alternative or additional feedback modes are also possible. In one operating mode, the feedback control signal 8 may be a PWM signal such that a duty cycle (e.g., the percentage of the time during which the pulse is at a high voltage) may be used to control a time during which a switch in the transmitter is turned on or off when switched at a fixed frequency. The duty cycle may be increased or decreased to accommodate more or less error between the power signal 2 and the target threshold voltage and/or current. In a second mode, the feedback control signal 8 may be a burst-mode PWM signal, such that a "burst" of pulses may be used to control the switch during one set time, and no pulses may be received at the switch during another set time. Similar to the first mode, bursts or lack thereof may be used to accommodate more or less error in the power signal 2. In a third mode, the feedback control signal 8 may be an FM signal, which may be used to control a frequency at which the switch is turned on or off. The frequency may be decreased or increased to accommodate more or less error in the power signal 2. According to an aspect of the present application, the multi-mode power isolator system 100 operates in any two or more of such modes.

In some embodiments, the feedback circuit 40 may automatically select a mode of operation according to various operating conditions of the multi-mode power isolator system 100. For example, a first mode may be employed in a first operating condition, and a second mode may be employed in a second operating condition. In this example, the feedback circuit 40 may detect a transition from the first operating condition to the second operating condition or vice-versa, and accordingly may switch from the first mode to the second mode (e.g. using an operating mode controller). Use of various modes depending on various operating conditions may allow for increased efficiency of operation in each of the various conditions. In the above example, the first mode may operate with greater efficiency than the second mode in the first operating condition, but may operate with less efficiency than the second mode in the second operating condition.

Aspects of the present application provide integrated multi-mode power isolator systems with multi-mode feedback control. The components of the power isolator systems may be integrated in various configurations. FIGS. 2A-2D illustrate various non-limiting implementations of multi-mode power isolator systems having multi-mode feedback control. Each implementation illustrates a different possible configuration for integrating components of the power isolator system within one or more integrated circuit packages. Other implementations are also possible.

Figure 2A:
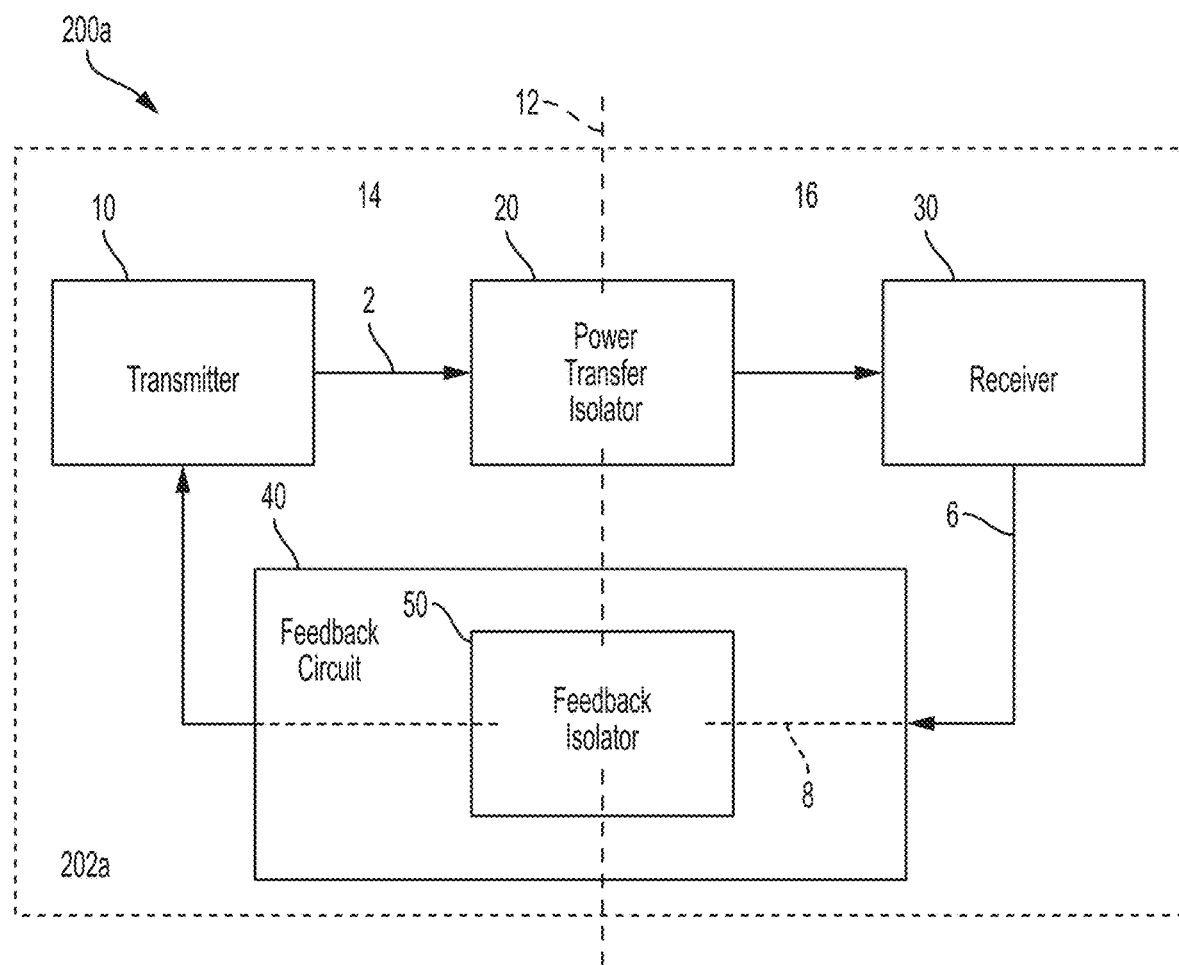
FIGS. 2A, 2B, 2C, and 2D illustrate various non-limiting implementations of a multi-mode power isolator having multi-mode feedback control, with differing placement of components of the power isolator.

FIG. 2A illustrates a first non-limiting example of an implementation for integrating the components of a multi-mode power isolator system with multi-mode feedback control. In the illustrated example, the components of the multi-mode power isolator system 200a are integrated on a single chip 202a. That is, the transmitter 10, power transfer isolator 20, receiver 30, feedback circuit 40 and feedback isolator 50 are all integrated on the chip 202a. Thus, the primary side 14 and secondary side 16 of the isolation barrier 12 may both lie within the chip 202a. The chip 202a may be a single packaged integrated circuit die. For example, the chip may be a silicon die with integrated circuitry and the isolators formed thereon.

Figure 2B:
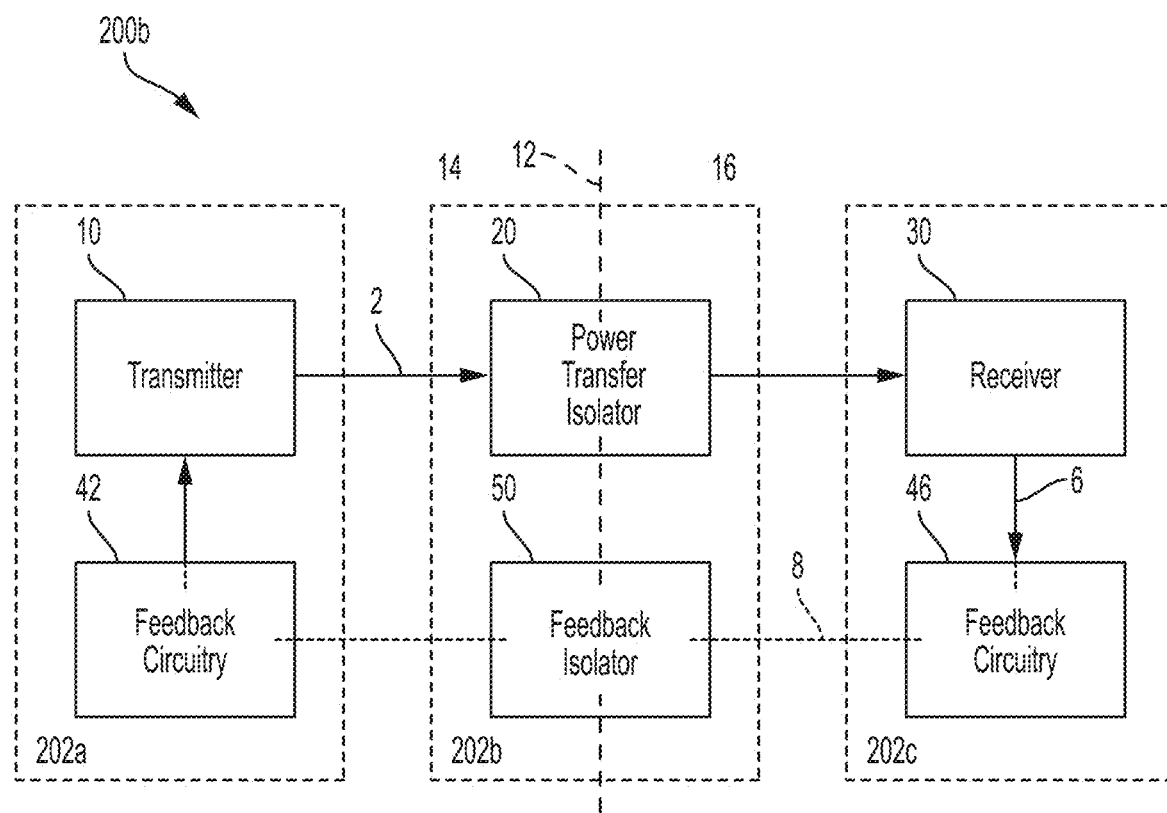

FIG. 2B illustrates a second non-limiting example of an implementation for integrating the components of a multi-mode power isolator system with multi-mode feedback control. In the illustrated example, the components of the multi-mode power isolator system 200b are divided between a first chip 202a, a second chip 202b and a third chip 202c That is, the transmitter 10 is located on the first chip 202a, the power transfer isolator 20 and feedback isolator 50 are on the second chip 202b, and the receiver 30 is on the third chip 202c. In this example, the feedback circuit 40 comprises primary side feedback circuitry 42 located on the first chip 202a, and secondary side feedback circuitry 46 located on the third chip 202c. The primary side feedback circuitry 42 and the secondary side feedback circuitry 46 may together be functionally equivalent to the feedback circuit 40. That is, the primary side feedback circuitry 42 may comprise components of the feedback circuit 40 which may be located on the primary side 14, such as a phase locked loop. Likewise, the secondary side feedback circuitry 46 may comprise components of the feedback circuit 40 which may be located on the secondary side 14 such as an error amplifier or comparator. Although both primary side feedback circuitry 42 and secondary side feedback circuitry 46 are illustrated in FIG. 2B, it should be appreciated that some embodiments may only comprise secondary side feedback circuitry 42. The first chip 202a, second chip 202b and third chip 202c may be a separately packaged integrated circuit, such as separate silicon dies.

Figure 2C:
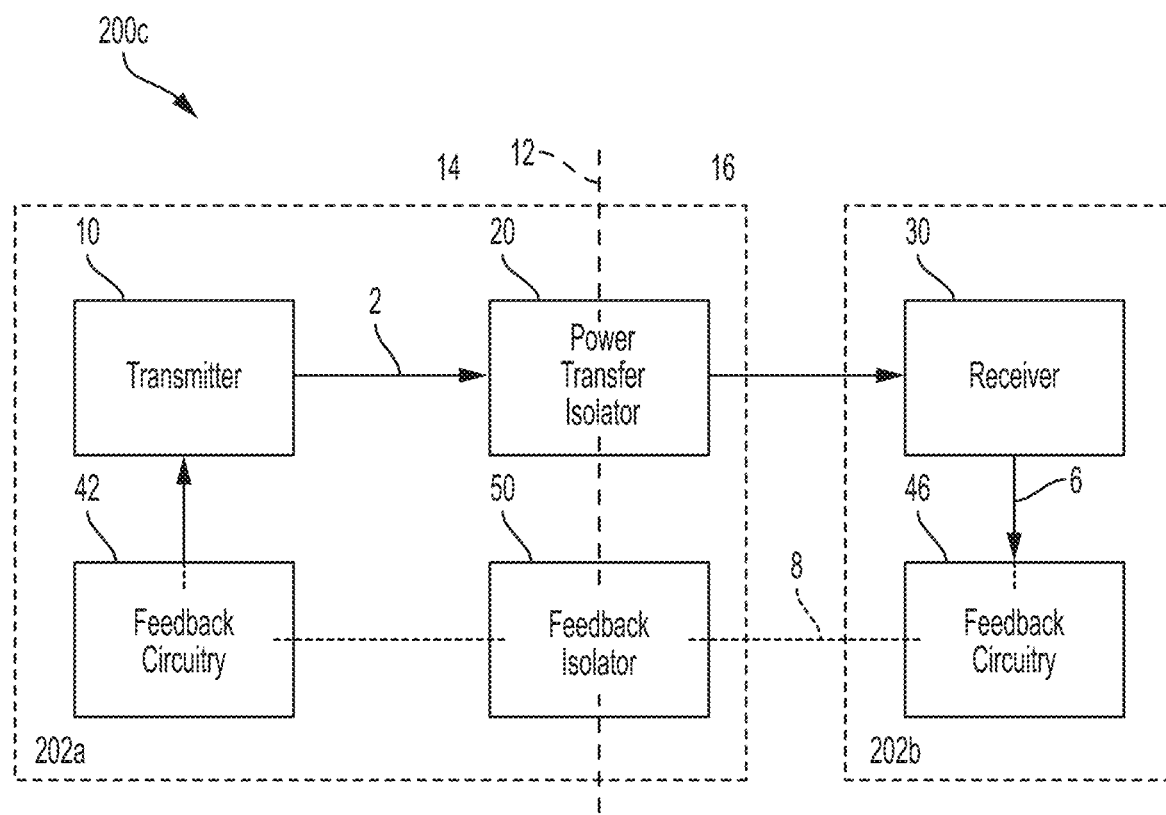

FIG. 2C illustrates a third non-limiting example of an implementation for integrating the components of a multi-mode power isolator system with multi-mode feedback control. In the illustrated example, the components of the multi-mode power isolator system 200c are divided between a first chip 202a and a second chip 202b. The transmitter 10, power transfer isolator 20, primary side feedback circuitry 42 and feedback isolator 50 are all located on the first chip 202a, and the receiver 30 and secondary side feedback circuitry 46 are located on the second chip 202b. The first chip 202a and the second chip 202b may be separately packaged integrated circuits, such as separate silicon dies.

Figure 2D:
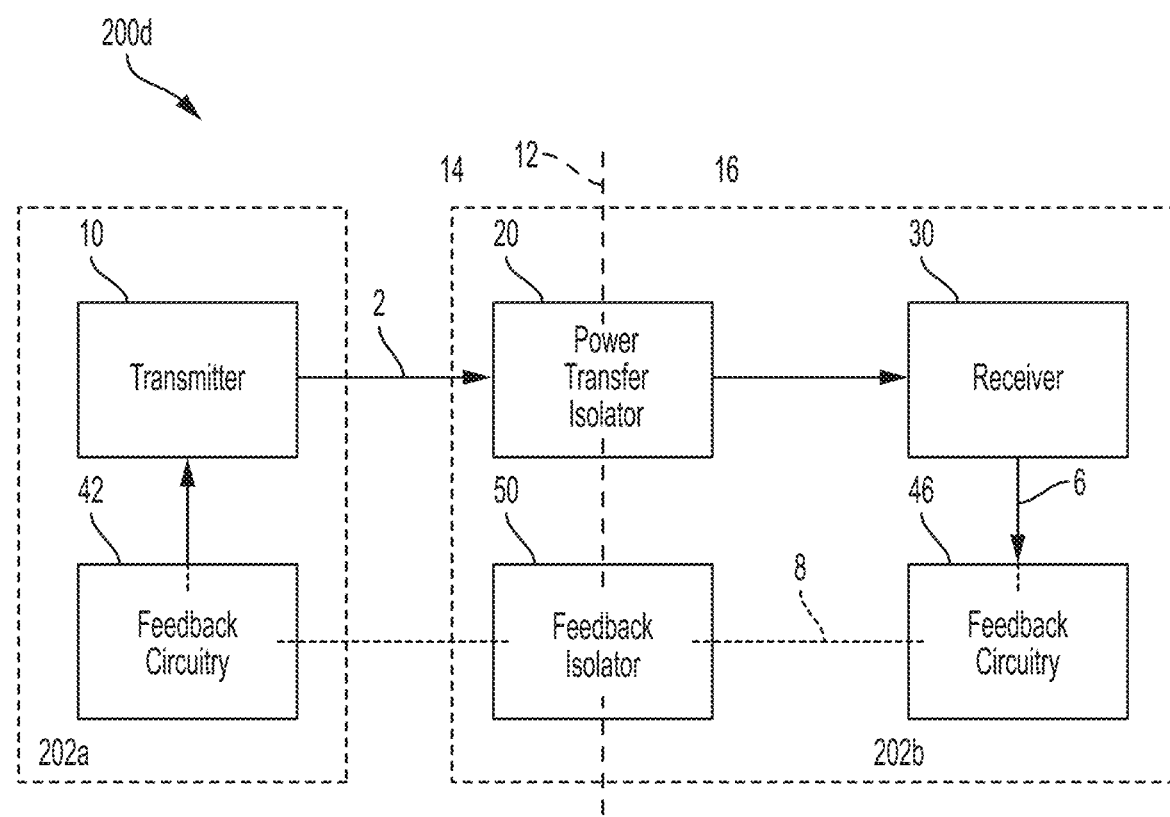

FIG. 2D illustrates a fourth non-limiting example of an implementation for integrating the components of a multi-mode power isolator system with multi-mode feedback control. In the illustrated example, as in the previous example, the components of the multi-mode power isolator system 200d are divided between a first chip 202a and a second chip 202b, and the first chip 202a and the second chip 202b may each be separately packaged integrated circuits. However, in this example the transmitter 10 and primary side feedback circuitry 42 are located on the first chip 202a, and the power transfer isolator 20, receiver 30, secondary side feedback circuitry 46 and feedback isolator 50 are all located on the second chip 202b.

Aspects of the present application provide integrated multi-mode power isolator systems with multi-mode feedback control. The power isolator systems may be implemented in various circuit configurations. FIGS. 3A, 4A and 5-7 illustrate various non-limiting implementations of multi-mode power isolator systems having multi-mode feedback control. Each implementation illustrates a different possible circuit configuration for the power isolator system. Other implementations are also possible.

Figure 3A:
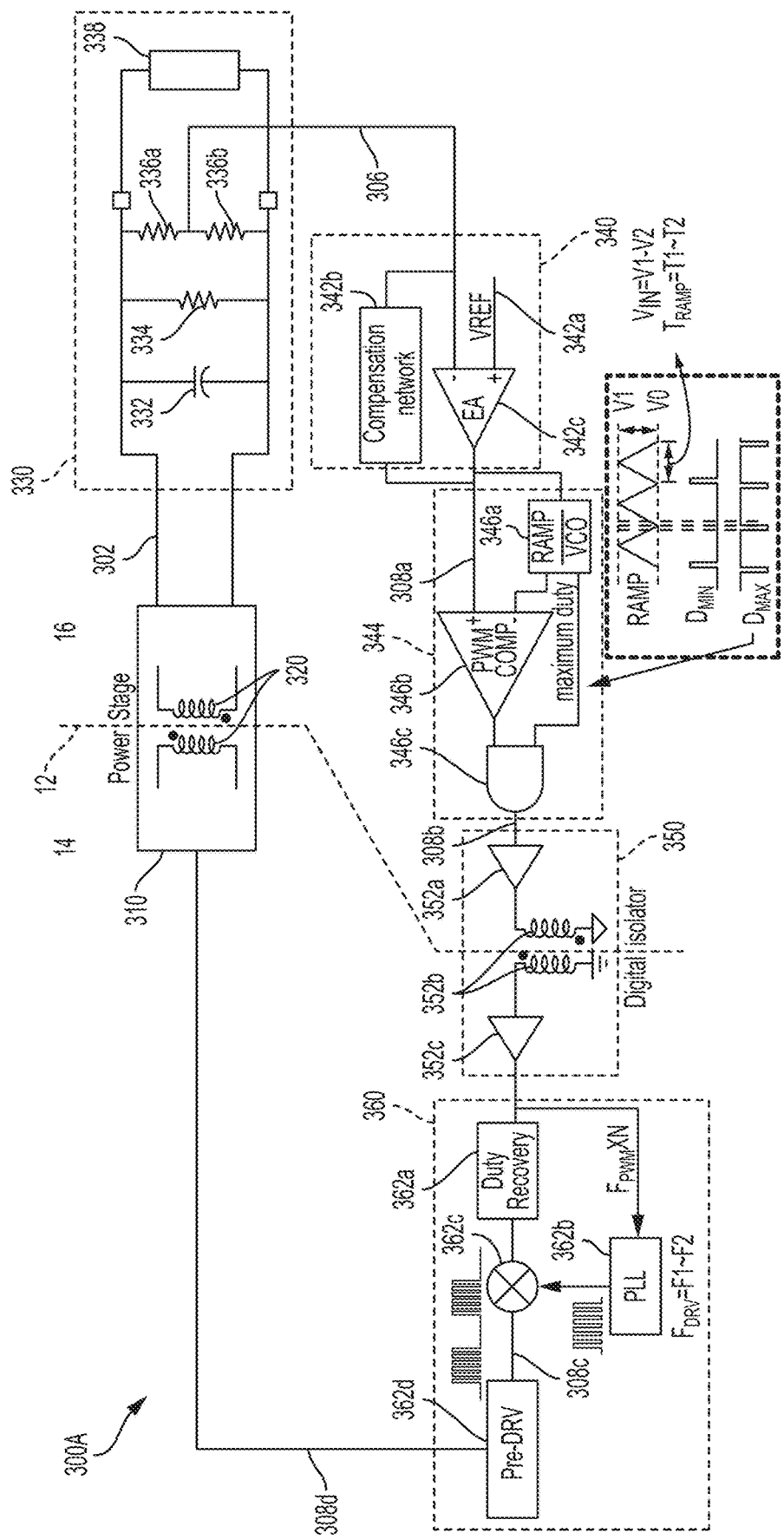
FIG. 3A is a circuit diagram of a multi-mode power isolator having multi-mode feedback control, according to a non-limiting embodiment of the present application.

FIG. 3A illustrates a first non-limiting example of a circuit configuration for implementing a multi-mode power isolator system with multi-mode feedback control. In the illustrated example, the multi-mode power isolator system 300A comprises a power stage 310 comprising a power transfer isolator 320, a load circuit 330 representing a receiver, a feedback circuit comprising an error calculation circuit 340, a feedback control circuit 344 and a driving signal generator 360, and a digital feedback isolator 350. The load circuit 330 and error calculation circuit 340 are located on the secondary side 16 of the isolation barrier 12, and the driving signal generator 360 and portions of the power stage 310 are located on the primary side 14 of the isolation barrier 12. The power stage 310 comprises a transformer 320 bridging the isolation barrier 12, and the feedback isolator 350 comprises a transformer 352b bridging the isolation barrier 12.

The power stage 310 may be configured to generate and deliver a power signal 302 to the load circuit 330. The power stage 310 may comprise one or more driving circuits (e.g., a MOS driver or gate driver) for generating a power signal 302 to be supplied to the load circuit 330. The transformer 320 may be configured to deliver the power signal 302 across the isolation barrier 12 to the load circuit 330. Thus, the transformer 320 may have a coil on the primary side 14 and a coil on the secondary side 16 of the isolation barrier 12. The coil on the secondary side 16 is connected to the load circuit 330.

The load circuit 330 may be configured to receive the power signal 302 and provide the power signal 302 over a load capacitor 332 to an attached load 338. The load circuit 330 may be further configured to sense the power signal 302 via sensing resistors 336a and 336b, and to generate an output signal 306 representative of the power signal 302. A rectifier or other AC to DC circuit (not shown) may optionally be positioned between the power stage 310 and the load capacitor 332, and may be configured to convert the received power signal 302 to direct current (DC). The load capacitor 332 is configured to provide the power signal 302 to the load 338, or to a resistor 334 if no load 338 is attached. The load capacitor 332 may be any capacitor for holding the power signal 302 constant for the load 338. The load 338 may be a circuit or device comprising many circuits which may be active or passive. Additionally, it should be appreciated that the load may vary with time. For example, the load may be light and draw little current at one time and may be heavy and draw high current at another time. The sensing resistors 336a and 336b are configured as a resistive divider for sensing the power signal 302 and generating the output signal 306. A voltage level between the sensing resistors 336a and 336b is proportional to a voltage level of the power signal 302. Thus, the voltage level between the sensing resistors 336a and 336b may represent the output signal 6 of FIG. 1. The resistive divider of sensing resistors 336a and 336b is a non-limiting example of a voltage sensing circuit, and other voltage sensing circuits may be used. It should also be appreciated that, although the load circuit 330 is illustrated in FIG. 3A as configured to sense the voltage level of the power signal 302, the load circuit 330 may alternatively be configured to sense a current level of the power signal 302. For example, a sensing resistor may be positioned in series with the load 338, and a voltage across the sensing resistor may be representative of the current level of the power signal 302. The output signal 306 is connected to the error calculation circuit 340.

The error calculation circuit 340 may be configured to generate an error signal 308a based on the received output signal 306 and a reference signal 342a. The error calculation circuit 340 may comprise a compensation network 342b and an error amplifier 342c. The reference signal 342a may be supplied by a voltage regulator (not shown) and may be representative of a target voltage and/or current threshold level for the power signal 302. The compensation network 342b may comprise one or more resistors and/or capacitors and may be configured to provide filtering for the error calculation circuit 340. The error amplifier 342c may be any suitable differential amplifier for outputting an amplified voltage difference between inputs. In the illustrated example, inputs of the error amplifier 342c are connected to the output signal 306 and the reference signal 342a. The compensation network 342b is connected to the output signal 306 at one end, and an output of the error amplifier 342c at a second end. The error signal 308a is located at the output of the error amplifier 342c where the second end of the compensation network 342b is connected. Thus, the error signal 308a is an error voltage reflective of an error in the power signal 302. The error signal 308a may be connected to the feedback control circuit 344.

The feedback control circuit 344 may be configured to generate a modulated signal 308b based on the error signal 308a. The feedback control circuit 344 may comprise a VCO with Ramp Generator 346a, a comparator 346b and a logic component 346c. In the illustrated example, the modulated signal 308b may be a PWM signal in accordance with PWM mode or an FM signal in accordance with FM mode. However, it should be appreciated that other modes such as PFM mode or a burst PWM mode may be implemented as well.

Additionally, it should be appreciated that maximum and minimum ramp voltages V0 and V1, as shown in FIG. 3A, may be any suitable voltages.

The VCO 346a may be configured to produce either a fixed or variable frequency ramp wave at a first output and either a fixed frequency maximum duty signal or variable frequency FM signal at a second output. The VCO 346a may be further configured to switch between PWM mode and FM mode depending on the error signal 308a as will be discussed with reference to the logic component 346c. The ramp wave is input to the comparator 346b along with the error signal 308a. The frequency of the FM signal may be adjusted based on the error signal 308a connected to an input of the VCO 346a. For example, as a voltage of the error signal 308a increases, the frequency of the FM signal may increase or decrease accordingly. The second output of the VCO 346a is connected to the logic component 346c.

The comparator 346b is configured to produce a PWM signal by comparing the ramp wave to the error signal 308a to send to the logic component 346c. The comparator 346b may comprise a positive input terminal, a negative input terminal and an output terminal, and may be configured to generate a digital signal at the output terminal having a high voltage when a voltage at the positive input terminal is greater than a voltage at the negative input terminal, and a low voltage otherwise. The digital signal may be a PWM signal based on the ramp wave and the error signal 308a. In the illustrated example, the positive input terminal of the comparator 346b is connected to the error signal 308a, and the negative input terminal of the comparator 346b is connected to the first output of the VCO 346a. Thus, the comparator 346b is configured to produce a PWM signal at the output terminal based on a comparison between a voltage of the error signal 308a and a voltage of the first output of the VCO 346a. The output terminal of the comparator 346b is connected to the logic component 346c.

The logic component 346c may be a single logic gate or a combination of logic gates configured to determine an operating mode of the feedback control circuit 344 based on the FM signal received from the second output of the VCO 346a and the PWM signal received from the comparator 346b. In FIG. 3A, the logic component is implemented as an AND gate. However, it should be appreciated that the logic component may alternatively be implemented as a multiplexer configured to select between outputting the PWM signal and the FM signal. The VCO 346a, comparator 346b and logic component 346c are configured such that, during PWM mode the PWM signal is output from the logic component 346c, and during FM mode the FM signal is output from the logic component 346c. For example, the VCO 346a may be configured to determine whether to operate in PWM mode or FM mode depending on the voltage of the error signal 308a. Accordingly, The second output of the VCO 346a may be configured to generate a signal having maximum duty to allow the PWM signal through the logic component 346c, or an FM signal configured to be allowed through the logic component 346c together with the maximum duty PWM signal from the comparator 346b. Thus, the feedback control circuit 344 may be configured to generate the modulated signal 308b as a PWM signal or FM signal in accordance with PWM mode or FM mode.

The feedback isolator 350 may be configured to transmit and receive the modulated signal 308b across the isolation barrier 12. In the illustrated example, the feedback isolator 350 comprises an encoder 352a on the secondary side 16 of the isolation barrier 12, a transformer 352b bridging the isolation barrier 12 and a decoder 352c on the primary side 14 of the isolation barrier 12. The encoder 352a and decoder 352c may be any suitable encoder and decoder for transmitting and receiving the modulated signal 308b via the transformer 352b. The transformer 352b comprises a transmit coil located on the secondary side 16 of the isolation barrier 12 coupled to the encoder 352a, and a receive coil located on the primary side 14 of the isolation barrier 12 coupled to the first coil and the decoder 352a. The decoder 352c is configured to provide the modulated signal 308b to the driving signal generator 360.

The driving signal generator 360 may be configured to generate a power control signal 308d based on the modulated signal 308b. In the illustrated example, the driving signal generator 360 comprises a recovery circuit 362a, a phase locked loop 362b, a mixer 362c and a pre-driver circuit 362d. The recovery circuit 362a and the phase locked loop 362b are both configured to receive the modulated signal 308b. The recovery circuit 362a may comprise a pulse or glitch filter, and may be configured to recover the modulated signal 308b. The recovery circuit 362a is connected to a first input of the mixer 362c, and the phase locked loop 362b is connected to a second input of the mixer 362c. The phase locked loop 362b is configured to generate a high frequency boosting signal based on the modulated signal 308b. For example, the phase locked loop 362b may comprise a VCO, a frequency divider and a phase comparator, such that a frequency divided VCO signal and the modulated signal 308b are connected to the phase comparator, with a resulting phase error connected back to the VCO. Thus, the phase locked loop 362b may be configured to generate the boosting signal having a frequency that is a multiple of the modulated signal 308b. Accordingly, the frequency of the boosting signal may be variable or fixed depending on the frequency of the modulated signal 308b. It should be appreciated that, although FIG. 3A illustrates the phase locked loop 362b as generating the boosting signal, alternative circuits may be used to generate the boosting signal. The phase locked loop 362b outputs the boosting signal to the second input of the mixer 362c. The mixer 362c may be configured to combine the modulated signal 308b with the boosting signal, resulting in a pre-driver signal 308c.

The mixer 362c may be configured to output the pre-driver signal 308c to the pre-driver circuit 362d. In the illustrated example, the pre-driver circuit 362d is configured to generate the power control signal 308d for driving the power stage 310 based on the pre-driver signal 308c. The pre-driver circuit 362d may comprise switches configured to receive the pre-driver signal 308b and operate MOS drivers or gate drivers in the power stage 310, which generate the power signal 302, using the power control signal 308d. Thus, the multi-mode power isolator system 300A may be configured to implement multi-modal feedback to control power delivery from the power stage 310 to the load circuit 330.

During operation of the multi-mode power isolator system 300A, the power signal 302 may be supplied by the power stage 310 to the load circuit 330 across the isolation barrier 12. In the illustrated example, the power signal 302 is supplied to the load circuit 330 via the transformer 320.

The power signal 302 may be received and sensed by the load circuit 330 to generate the output signal 306. In the illustrated example, the power signal 302 is received by the rectifier (not shown) and used to charge the load capacitor 332. The load capacitor holds the power signal 302 at a relatively constant voltage, or a slowly varying voltage, for the load 338, or discharges the power signal 302 to the resistor 334 when no load is attached. The sensing resistors 336a and 336b generate the output signal 306 based on the power signal 302. The power signal 302 is divided by the sensing resistors 338a and 338b, resulting in the output signal 306 being proportionally representative of the power signal 302. The output signal 306 is fed to the error calculation circuit 340.

The error calculation circuit 340 may generate the error signal 308a based on the output signal 306 and the reference signal 342a. In the illustrated example, the error amplifier 342c together with the compensation network 342b determine (e.g., calculate) the error signal 308a based on a difference in voltage between the output signal 306 and the reference signal 342a. Since the output signal 306 is based on the power signal 302, and the reference signal 342a is based on the target voltage/current threshold level of the power signal 302, the resulting error signal 308a is based on a difference (sometimes referred to herein as an error) between the target voltage/current threshold level and the power signal 302. For example, larger error may translate to the error signal 308a having an increased voltage. The error calculation circuit 340 transmits the error signal 308a to the feedback control circuit 344.

The feedback control circuit 344 may generate the modulated signal 308b based on the error signal 308a and an operating mode selected by the VCO 346a. In the illustrated example, the operating modes are PWM mode and FM mode. The error signal 308a is compared to a fixed frequency ramp wave at the first output of the VCO 346a in the comparator 346b to produce the PWM signal for use in PWM mode, and in FM mode the error signal 308a is compared to a variable frequency ramp wave to produce a maximum duty signal having a variable frequency. The duty cycle of the PWM signal may vary according to the error signal 308a. For example, the voltage range of the ramp wave may be fixed, but the voltage of the error signal 308a may change depending on the power signal 302 relative to the target voltage/current threshold level. For one period of time, the voltage of the power signal 302 may be equal to the target voltage/current threshold level. During that period of time, the error signal may have a lower voltage than the ramp wave for the entire period of time resulting in the PWM signal outputting low voltage for the entire period of time. However, in a next period of time the power signal 302 may fall below the target voltage/current threshold level, and the error signal 308a may rise in voltage such that it is greater than the ramp wave for some percentage of the period of time. The percentage of time during which the voltage of the error signal 308a is greater than the ramp wave the PWM signal will output high voltage, and during the remainder of the time the PWM signal will output low voltage. Thus, the duty cycle of the PWM signal may be controlled by the error signal 308a. At maximum duty, the PWM signal may have maximum pulse width. Accordingly, the VCO 346a and comparator 346b may generate the PWM signal based on the error signal 308a.

The second output of the VCO 346a may generate either a maximum duty signal or an FM signal with frequency controlled by the error signal 308a, and may switch between PWM mode and FM mode depending on the voltage of the error signal 308a. For example, the second output of the VCO 346a may switch between outputting the maximum duty signal and the FM signal depending on the error signal 308a. When the error signal 308a is lower than a voltage threshold level, the second output of the VCO 346a may be the maximum duty signal in accordance with PWM mode. When the voltage of the error signal 308a is above the voltage threshold level, the second output of the VCO 346a may be the FM signal with frequency controlled by the voltage of the error signal 308a in accordance with FM mode. The frequency of the FM signal may decrease or increase as the voltage of the error signal 308a increases or decreases. Thus, the VCO 346a may produce a maximum signal or an FM signal based on the error signal 308a.

The logic component 346c output either the PWM signal or the FM signal for transmitting to the digital isolator 350 as the modulated signal 308b. In the illustrated example, the logic component 346c is an AND gate which outputs the PWM signal when the duty cycle of the PWM signal is below a maximum duty level, and which outputs the FM signal when the duty cycle of the PWM signal reaches the maximum duty level. For example, in PWM mode the second output of the VCO 346a generates a maximum duty signal which allows the PWM signal from the comparator 346b to be output by the logic component 346c as the modulated signal 308b. In FM mode, the second output of the VCO 346a generates an FM signal with frequency controlled by the error signal 308a, and the PWM signal from the comparator 346b is a maximum duty signal, which allows the FM signal to be output by the logic component 346c as the modulated signal 308b. Thus, the logic component 346c outputs either the PWM or FM signal in accordance with the PWM or FM mode of operation for generating the modulated signal 308b to be sent via the digital isolator 350.

The digital isolator 350 may transfer the modulated signal 308b across the isolation barrier 12. In the illustrated example, the modulated signal 308b is encoded by the encoder 352a and transmitted over the transformer 352b from the secondary side 16 to the primary side 14. The modulated signal 308b is received and decoded by the decoder 352c and passed to the driving signal generator 360.

The driving signal generator 360 may recover and up-convert the modulated signal 308b to a higher frequency resulting in the pre-driver signal 308c, and may generate the power control signal 308d based on the pre-driver signal 308c. The ability to send a relatively low frequency signal across the isolation barrier and then up-convert the signal may facilitate low power operation and avoid other drawbacks of sending high frequency signals across the transformer 352b. In the illustrated example, the recovery circuit 362a filters out high frequency components which entered the modulated signal 308b during transmission by the digital isolator 350. The modulated signal 308b is separately fed to the phase locked loop 362b and used to generate a boosting signal for mixing with the filtered output of the recovery circuit 362a in the mixer 362c. A VCO in the phase locked loop 362b may generate the boosting signal, and a phase comparator may clamp the boosting signal frequency to multiple of the frequency of the modulated signal 308b. The boosting signal is then combined with the modulated signal 308b in the mixer 362c. Thus, the pre-driver signal 308c emerges from the mixer 362c having the high frequency of the boosting signal and encoded with the low frequency duty cycle component of the modulated signal 308b. The pre-driver signal 308c is fed to the pre-driver circuit 362d where it is used to generate the power control signal 308d. For example, the pre-driver circuit 362d may feed the pre-driver signal 308c to a switch that may generate the power control signal 308d for adjusting the power signal 302 in a MOS driver or gate driver in the power stage 310. The pre-driver signal 308c may use aspects of the PWM signal or the FM signal to operate the switch depending on the operating mode of the multi-mode power isolator system 300A.

In some embodiments, operating modes of the multi-mode power isolator system 300A may be configured to optimize efficiency and effectiveness of power delivery from the power stage 310 to the load circuit 330. In the illustrated embodiment, the load 338 may vary from being heavy (e.g., drawing large current) to being light (e.g., drawing small current). During light load, PWM mode may provide more efficient power delivery than FM mode. For example, the PWM mode may provide small adjustments to the power signal 302 by varying the duty cycle in accordance with small deviations from the target voltage/current threshold level. However during heavy load, FM may have a higher output power capacity than PWM mode. For example, the FM mode may provide larger adjustments to the power signal 302 by decreasing the frequency of the FM signal as deviations from the target voltage/current threshold become too large to be accommodated by an increased duty cycle.

Accordingly, the multi-mode power isolator system 300A may be configured to detect when the load 338 changes from light to heavy or vice versa and provide the appropriate mode of power control signal 308d to the power stage 310. In the illustrated example, the power signal 302 may drift away from the target voltage or current threshold level due to heavy load. Accordingly, the output signal 306 may be sensed and used to calculate the error signal 308a. The error signal 308a may be large enough to cause the PWM signal to reach the maximum duty level. Thus, the VCO 346a may automatically select the FM mode of operation based on detection of the heavy load as the error signal 308a reaching a voltage threshold level. However, the load 338 may change from heavy to light. Deviations from the target voltage or current threshold level may become smaller, and the error signal 308a may decrease accordingly. The duty cycle of the PWM signal may fall below the maximum duty threshold, and the VCO 346a may likewise select the PWM mode.

Figure 3B:
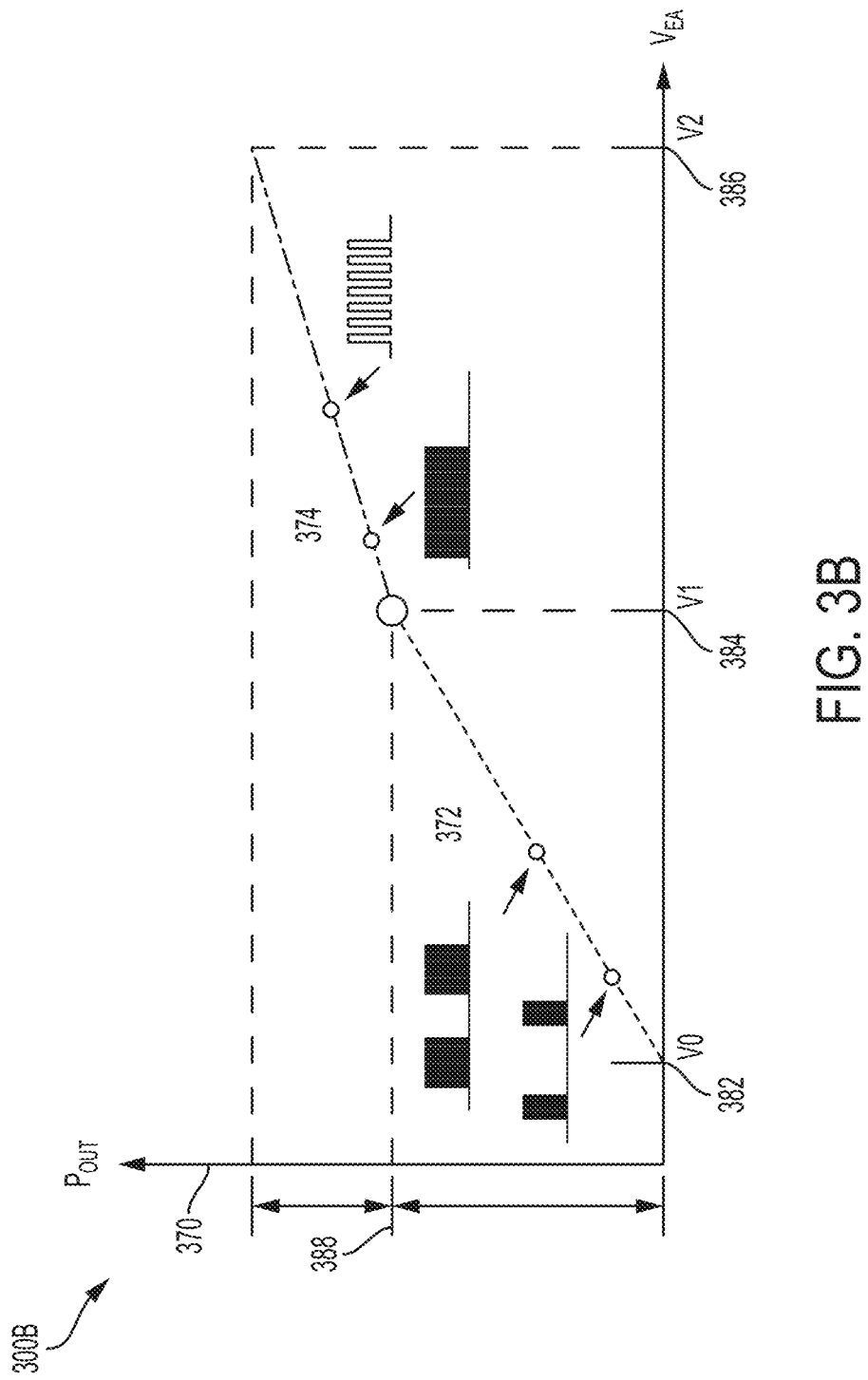
FIG. 3B is a graph illustrating output power of the a multi-mode power isolator of the type shown in FIG. 3A, according to a non-limiting example.

FIG. 3B illustrates a graph 370 of output power versus feedback error voltage for the two operating modes of the example configuration in FIG. 3A. A first section 372 of the graph 370 shows output power versus error voltage in PWM mode, and a second section 374 shows output power versus error voltage in FM mode. The error voltage may refer to a voltage level of the error signal 308a, and the output power may refer to a power level of the resulting power signal 302 after being adjusted.

In the illustrated graph, operating modes are determined by error voltage, such that PWM mode and FM mode are separated by an error voltage threshold 384. When the error voltage is at a first level 382, the multi-mode power isolator system 300A operates in PWM mode, and the output power increases as the duty cycle of the PWM signal increases at a fixed operating frequency. However, when the error voltage increases beyond the threshold 384, the duty cycle may reach maximum duty (e.g. 100%) corresponding to a maximum output power 388 of PWM mode. Accordingly, the multi-mode power isolator system 300A may transition to FM mode in order to increase beyond the maximum output power 388 of PWM mode. Thus, when the error voltage is at a second level 386 greater than the threshold 384, it operates in FM mode. During FM mode, the output power increases as the operating frequency decreases.

Figure 4A:
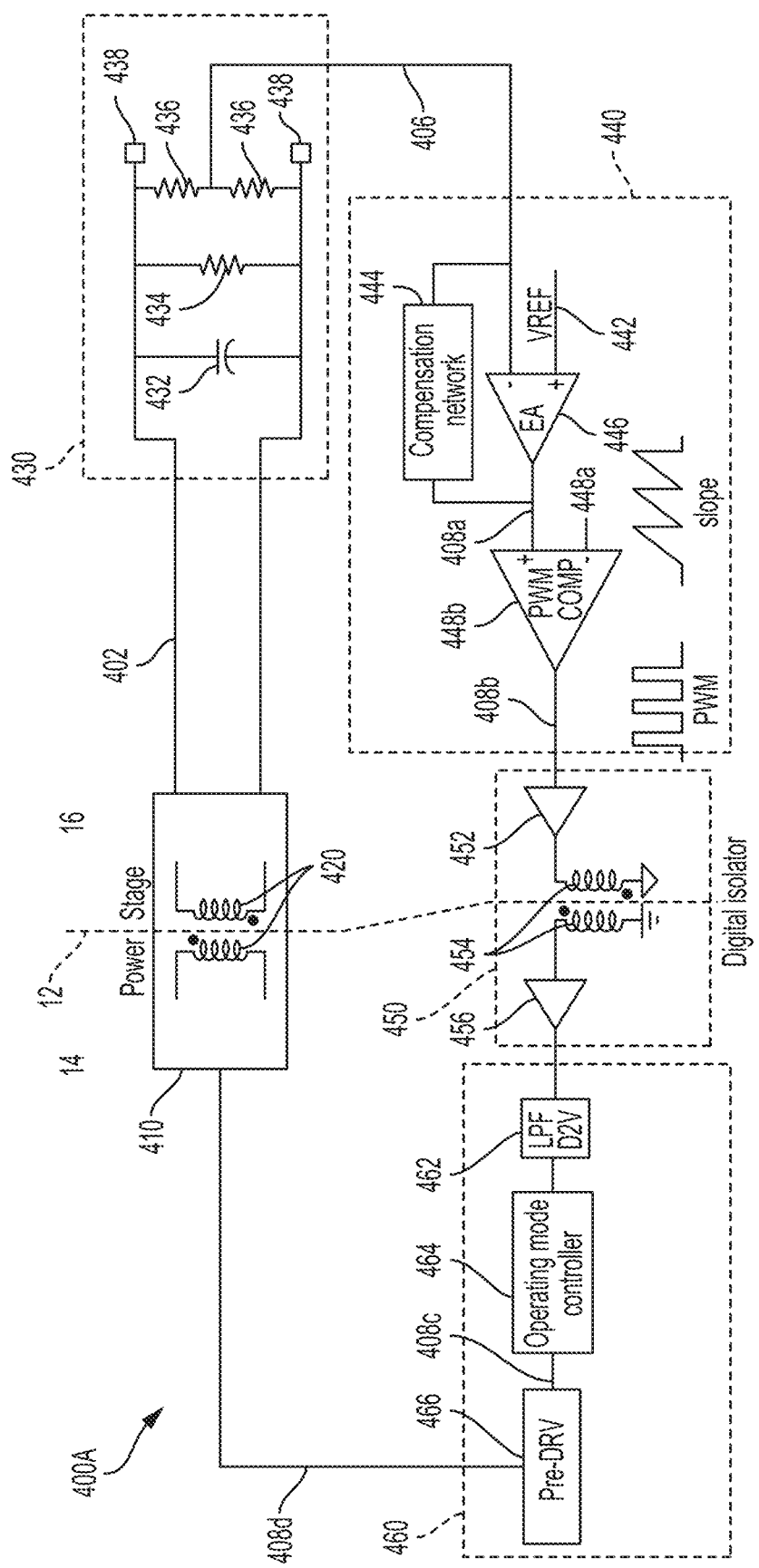
FIG. 4A illustrates an alternative multi-mode power isolator according to a non-limiting embodiment of the present application.

FIG. 4A illustrates a second non-limiting example of a circuit configuration for implementing a multi-mode power isolator system with multi-mode feedback control. In FIG. 4A, selection of a feedback operating mode takes place on the primary side 14 rather than the secondary side 16 of the isolation barrier 12. The multi-mode power isolator system 400A comprises power stage 410, load circuit 430 representing a receiver, a feedback signal generator 440 and a feedback controller 460, and a digital feedback isolator 450. The feedback signal generator 440 and feedback controller 460 may represent a feedback control circuit. The feedback controller 460 is located on the primary side 14 of the isolation barrier 12, and the load circuit 430 and the feedback signal generator 440 are located on the secondary side 16 of the isolation barrier 12. The power stage 410 comprises a transformer 420 bridging the isolation barrier 12, and the feedback isolator 450 comprises a transformer 454 bridging the isolation barrier 12. The multi-mode power isolator system 400A is configured to operate in either PWM mode or FM mode.

The power stage 410 may be configured to generate and deliver a power signal 402 to the load circuit 430, which may be configured to sense the power signal 402 and generate a corresponding output signal 406. In the illustrated example, the power stage 410 operates in the manner previously described in connection with the power stage 310 as described in the first example, and the load circuit 430 operates in the manner previously described in connection with the load circuit 330. The load circuit 430 is connected to the feedback signal generator 440.

The feedback signal generator 440 may comprise an error amplifier 446 configured to generate an error signal 408a based on the output signal 406 and a reference signal 442, and a comparator 448b configured to generate a PWM signal 408b based on the error signal 408a and a ramp wave 448a. A compensation network 444 may be connected between the output signal 406 and an output of the error amplifier 446. In the illustrated example, the error amplifier 446, the compensation network 444 and the reference signal 442 operate in the manner previously described in connection with the error amplifier 342c, the compensation network 342b and the reference signal 342a of the first example, respectively. Accordingly, the output of the error amplifier 446 is configured to generate the error signal 408a based on a voltage difference between the output signal 406 and the reference signal 442. The reference signal 442 may be representative of the target voltage/current threshold level of the power signal 402. The output of the error amplifier 446 is connected to the comparator 448b. The comparator 448b is configured to receive the error signal 408a at a positive input terminal, and to receive the ramp wave 448a at a negative input terminal. An oscillator (not shown) may be connected to the negative input terminal and may be configured to generate the ramp wave 448a at a fixed frequency. The comparator 448b is configured to generate the PWM signal 408b with a duty cycle that varies according to a voltage difference between the error signal 408a and the ramp wave 448a. The comparator 448b is connected to the feedback isolator 450.

The feedback isolator 450 is configured to transmit the PWM signal 408b from the secondary side 16 of the isolation barrier 12 to the primary side 14 via the transformer 454. The feedback isolator 450 further comprises an encoder 452 configured to encode the PWM signal 408b on the secondary side 16 and a decoder 456 configured to decode the PWM signal 408b on the primary side 14. In the illustrated example, the feedback isolator 450 operates in the manner previously described in connection with the feedback isolator 350 of the first example. The feedback isolator 450 is connected to the feedback controller 460.

The feedback controller 460 comprises an operating mode controller 464 configured to receive the PWM signal 408b from the feedback isolator 450 via a recovery circuit 462, to select either PWM mode or FM mode based on the received PWM signal 408b, and to generate a modulated signal 408c according to the selected PWM or FM mode. The feedback controller 460 further comprises a pre-driver circuit 466 configured to generate a control signal 408d based on the modulated signal 408c for adjusting operation of the power stage 410. The recovery circuit 462 may comprise a low-pass-filter and a duty-to-voltage circuit. The duty-to-voltage circuit may be configured to output a voltage signal through the low-pass-filter to the operating mode controller 464 depending on a duty cycle of the PWM signal 408b. The low-pass-filter may limit ripple and frequency of the voltage signal such that the result is a DC signal. In some embodiments, the voltage signal is a reproduction of the error signal 408a. In some embodiments, the recovery circuit 462 is a digital filter plus a digital-to-analog converter (DAC). The operating mode controller 464 may comprise a VCO, a PWM comparator and a mixer. The VCO may be configured to generate a high frequency boosted signal with a frequency that may be controlled by the voltage signal. The boosted signal may have a fixed or variable frequency depending on the voltage signal. The PWM signal generator may be configured to produce a PWM signal based on a comparison between the voltage signal and a fixed frequency ramp wave. The resulting PWM signal from the PWM signal generator may have a duty cycle different from the PWM signal 408b. The mixer may be configured to combine the PWM signal and the boosted signal to generate the modulated signal 408c. In some embodiments, a DCO may be used instead of the VCO. The operating mode controller 464 is connected to the pre-driver circuit 466.

The pre-driver circuit 466 may comprise a switch configured to receive the modulated signal 408c and to generate the control signal 408d for controlling a driving circuit in the power stage 410. The control signal 408d may be configured to adjust the power signal 402. Thus, the multi-mode power isolator system 400A may be configured to provide multi-mode feedback to the power stage 410 based on the power signal 402 received at the load circuit 430.

During operation of the multi-mode power isolator system 400A, the power signal 402 is generated by one or more driver circuits in the power stage 410 and transmitted across the isolation barrier 12 via the transformer 420 to the load circuit 430. The power signal 402 is sensed in the load circuit 430 resulting in the output signal 406.

The output signal 406 is received by the feedback signal generator 440 and used to generate the PWM signal 408b via the error amplifier 446 and the comparator 448b. The output signal 406 is fed to the error amplifier 446 along with the reference signal 442. The error amplifier 446, together with the compensation network 444, generates an error signal 408a to send to the comparator 448b. The comparator 448b compares the error signal 408a to the ramp wave 448a, and outputs the PWM signal 408b with duty cycle controlled by the error signal 408a. The PWM signal 408b is then passed to the digital isolator 450.

The digital isolator 450 may transmit the PWM signal 408b across the isolation barrier 12. In the illustrated embodiment, the PWM signal 408b is encoded using the encoder 452, sent via the transformer 454, and decoded using the decoder 456. The PWM signal 408b is then transmitted to the feedback controller 460.

The feedback controller 460 may generate the modulated signal 408c based on the PWM signal 408b, and may also generate the control signal 408d based on the modulated signal 408c to modify operation of the power stage 410. In the illustrated embodiment, the recovery circuit 462 filters the PWM signal 408b and outputs a voltage signal based on a duty cycle of the PWM signal 408b. A duty-to-voltage circuit in the recovery circuit 462 may encode the duty cycle of the PWM signal 408b into the voltage signal, and a low-pass-filter of the recovery circuit 462 may cause the voltage signal to be a DC signal. For example, as the duty cycle of the PWM signal 408b increases, the voltage signal may increase. Thus, the voltage signal may be representative of the duty cycle of the PWM signal 408b. The recovery circuit may then output the voltage signal to the operating mode controller 464. The VCO of the operating mode controller 464 may produce a fixed or variable frequency boosting signal depending on the voltage level of the voltage signal and a corresponding mode. For example, if the voltage signal is below a voltage threshold level, PWM mode may be selected. In PWM mode, the PWM comparator may output the PWM signal below maximum duty and the VCO may produce the boosted signal at a fixed high frequency. The two signals may be fed to the mixer to generate the modulated signal 408c as a PWM signal. If the voltage signal is above the voltage threshold level, then FM mode may be selected. In FM mode, the PWM comparator may output the PWM signal at maximum duty, and the VCO may produce the boosted signal at a variable frequency controlled by the voltage signal. The two signals may be fed to the mixer to generate the modulated signal 408c as an FM signal.

The modulated signal 408c is transmitted to the pre-driver circuit 466. The pre-driver circuit 466 generates the control signal 408d based on the modulated signal 408c to adjust the power signal 402 in the power stage 410. For example, the modulated signal 408c may be applied to a switch in the pre-driver circuit 466, which may control a driver circuit in the power stage 410 with a control signal 408d to modify the power signal 402. Thus, the multi-mode power isolator system 400A uses multi-mode feedback to control the power signal 402 based on the output signal 406 sensed at the load circuit 430.

Figure 4B:
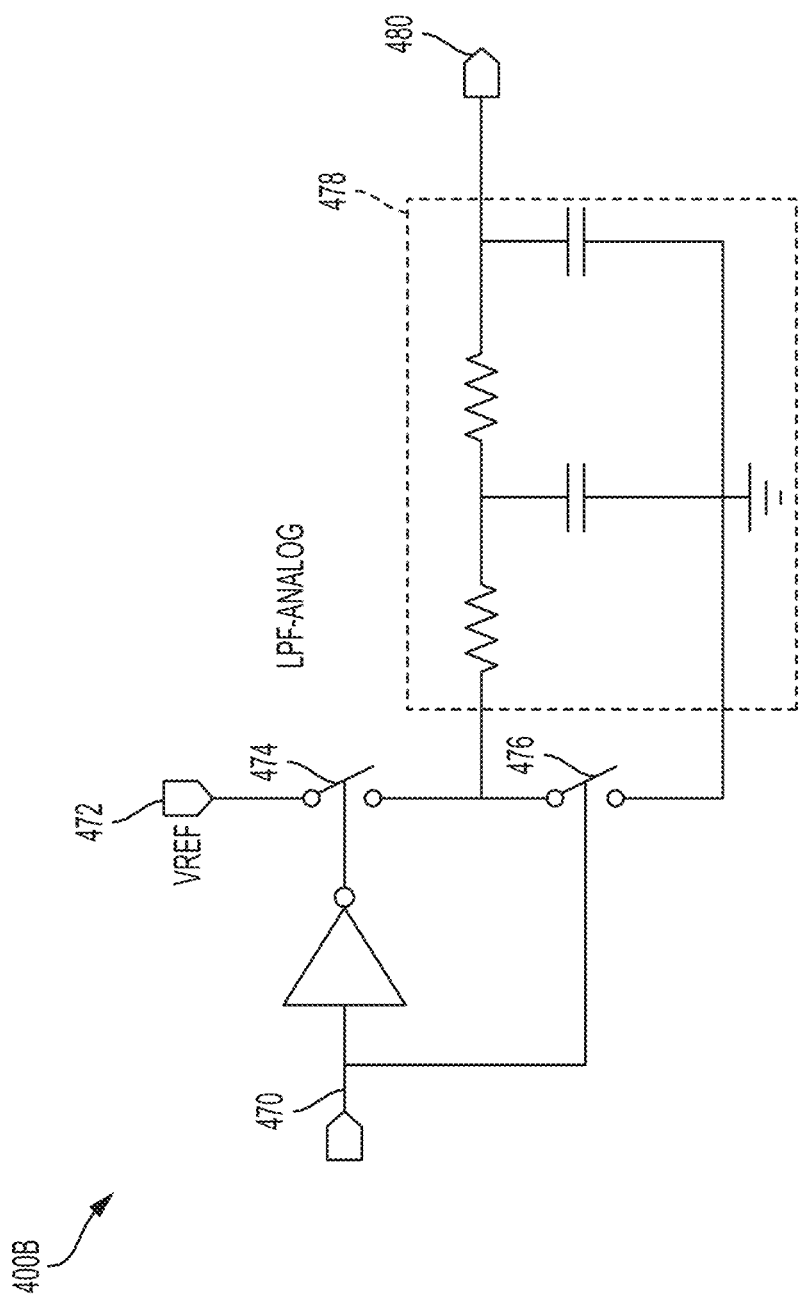
FIG. 4B is a circuit diagram of a recovery circuit for use in a multi-mode power isolator according to a non-limiting example.

FIG. 4B illustrates a non-limiting example of a recovery circuit for use in a multi-mode power isolator (e.g. the recovery circuit 462 in FIG. 4A). In FIG. 4B, a recovery circuit 400B comprises a reference voltage 472, a charging switch 474, a discharging switch 476 and a low-pass-filter 478. The reference voltage 472, charging switch 474 and discharging switch 476 may be an implementation of a duty-to-voltage circuit. The recovery circuit 400B may be configured to receive an input signal 470 (e.g. PWM signal 408b) and to generate an output signal 480 for transmitting to a mode controller (e.g. operating mode controller 464). In the illustrated example, the recovery circuit 400B may be configured to generate the output signal 480 at an output capacitor of the low-pass-filter 478 based on the input signal 470 by charging the output capacitor with the reference voltage 472 via the charging switch 474, and by discharging the output capacitor to ground via the discharging switch 476. The discharging switch 476 is controlled by the input signal 470 and the charging switch 474 is controlled by an inverse of the input signal 470. The discharging switch 476 may be configured to discharge the output capacitor to ground when the input signal 470 is low, and the charging switch 474 may be configured to configured to charge the output capacitor with the reference voltage 472 when the input signal 470 is high. The input signal may be a PWM signal. Accordingly, the output signal 480 may be close to ground when the input signal 470 has a lower duty cycle, and the output signal 480 may be closer to the reference voltage 472 when the input signal 470 has a higher duty cycle. Further, the output voltage 480 may reach a voltage threshold level when the duty cycle reaches a maximum duty. The low-pass-filter 478 may be configured to minimize magnitude and frequency of ripple in the output signal 480. Thus, the output signal 480 may be a DC signal.

During operation of the recovery circuit 400B, the input signal 470 may open and close the charging switch 474 and/or the discharging switch 476, resulting in the output signal 480 at the output capacitor of the low-pass-filter 478. When the input signal 470 is high, the charging switch 474 may close and may charge the output signal 480 with the reference voltage 472 via the low-pass-filter 478. When the input signal 470 is low, the discharging switch 476 may close and discharge the output signal 480 to ground via the low-pass-filter 478. In the illustrated example, the input signal 470 may be a PWM signal. The duty cycle of the PWM signal may control a voltage level of the output signal 480. For example, a lower duty cycle may cause the charging switch 474 to charge the output signal 480 to a lower voltage level. However, as the duty cycle of the input signal 470 increases, the output signal 480 may be charged to a higher voltage level. At maximum duty, the output signal 480 may reach a voltage threshold level. Accordingly, the mode controller configured to receive the output signal 480 may determine an operating mode depending on whether the voltage threshold level of the output signal 480 is reached. The low-pass-filter 478 may limit a rate at which the output signal 480 charges or discharges. Accordingly, ripple in the output signal 480 may be small in magnitude and low in frequency. Thus, the output signal 480 may be a DC signal.

Figure 5:
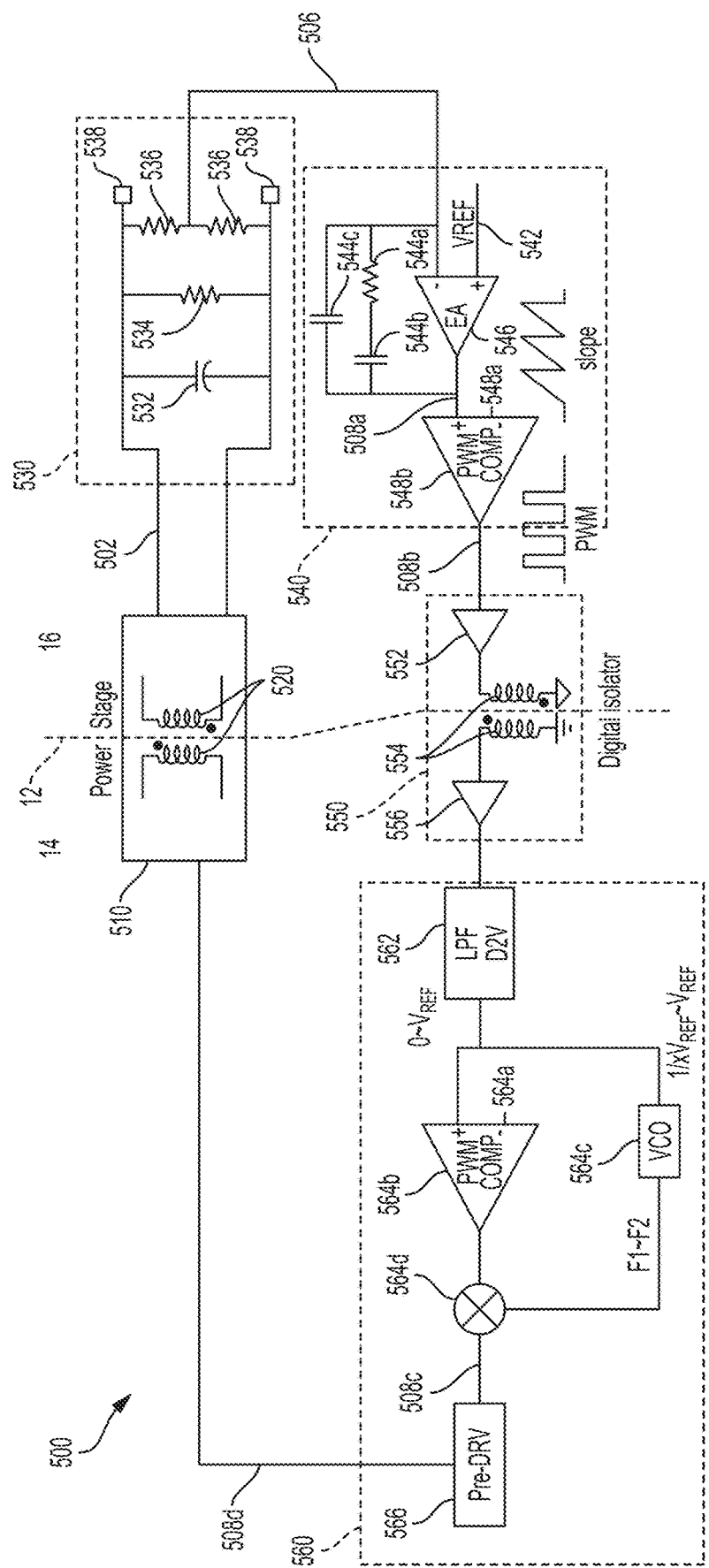
FIG. 5 illustrates an alternative multi-mode power isolator according to a non-limiting embodiment of the present application.

FIG. 5 illustrates a third non-limiting example of a circuit configuration for implementing a multi-mode power isolator system with multi-mode feedback control. In FIG. 5, selection of a feedback operating mode is performed using a second comparator, a VCO and a mixer on the primary side 14 of the isolation barrier 12. The multi-mode power isolator system 500 comprises a power stage 510, a load circuit 530 representing a receiver, a feedback signal generator 540 and a feedback controller 560 in combination representing a feedback control circuit, and a digital feedback isolator 550. The feedback controller 560 is located on the primary side 14 of the isolation barrier 12, and the load circuit 530 and the feedback signal generator 540 are located on the secondary side 16 of the isolation barrier 12. The power stage 510 comprises a transformer 520 located at the isolation barrier 12, and the feedback isolator 550 comprises a transformer 554 located at the isolation barrier 12. The multi-mode power isolator system 500 is configured to operate in either PWM mode or FM mode.

The power stage 510 may be configured to generate and deliver a power signal 502 to the load circuit 530, which may be configured to sense the power signal 502 and generate a corresponding output signal 506. In the illustrated example, the power stage 510 operates in the manner previously described in connection with the power stage 310 as described in the first example, and the load circuit 530 operates in the manner previously described in connection with the load circuit 330. The load circuit 530 is connected to the feedback signal generator 540.

The feedback signal generator 540 may comprise an error amplifier 546 configured to generate an error signal 508a based on the output signal 506 and a reference signal 542, and a PWM comparator 548b configured to generate a PWM signal 508b based on the error signal 508a and a ramp wave 548a. A compensation network comprising a resistor 544a and capacitors 544b and 544c may be connected between the output signal 506 and an output of the error amplifier 546. The output of the error amplifier 546 is configured to generate the error signal 508a based on a voltage difference between the output signal 506 and the reference signal 542. The reference signal 542 may be representative of the target voltage/current threshold level of the power signal 502. The output of the error amplifier 546 is connected to the PWM comparator 548b. The PWM comparator 548b is configured to receive the error signal 508a at a positive input terminal, and to receive the ramp wave 548a at a negative input terminal. An oscillator (not shown) may be connected to the negative input terminal and may be configured to generate the ramp wave 548a at a fixed frequency. The PWM comparator 548b is configured to generate the PWM signal 508b with a duty cycle that varies according to a voltage difference between the error signal 508a and the ramp wave 548a. The PWM comparator 548b is connected to the feedback isolator 550.

The feedback isolator 550 is configured to transmit the PWM signal 508b from the secondary side 16 of the isolation barrier 12 to the primary side 14 via the transformer 554. The feedback isolator 550 further comprises an encoder 552 configured to encode the PWM signal 508b on the secondary side 16 and a decoder 556 configured to decode the PWM signal 508b on the primary side 14. In the illustrated example, the feedback isolator 550 operates in the manner previously described in connection with the feedback isolator 350 of the first example. The feedback isolator 550 is connected to the feedback controller 560.

The feedback controller 560 is configured to receive the PWM signal 508b from the feedback isolator 550 at a recovery circuit 562, to select either PWM mode or FM mode based on an output voltage received from the recovery circuit 562, and to generate a modulated signal 508c according to the selected PWM or FM mode. The feedback controller 560 is further configured to generate a control signal 508d based on the modulated signal 508c for adjusting operation of the power stage 510. The recovery circuit 562 may comprise a low-pass-filter and a duty-to-voltage circuit. The recovery circuit 562 may operate in the manner previously described in connection with the recovery circuit 400B of FIG. 4B. A control comparator 564b may be configured to compare an output voltage signal from the recovery circuit 562 with a fixed frequency control ramp 564a. An output of the control comparator 564b may be a PWM control signal connected to a mixer 564d. A VCO 564c may be configured to generate a fixed or variable high frequency boosting signal in accordance with PWM or FM mode, depending on a voltage level of the voltage signal received from the recovery circuit 562. The boosting signal may have a fixed frequency when operating in PWM mode. The VCO 564c may be configured to control the variable frequency of the boosting signal based on the voltage signal when operating in FM mode. The mixer 564d may be configured to generate the modulated signal 508c by combining the PWM control signal output by the control comparator 564b with the boosting signal output by the VCO 564c. In some embodiments, a DCO is used instead of the VCO 564c. The mixer 564d is connected to the pre-driver circuit 566.

The pre-driver circuit 566 may comprise a switch configured to receive the modulated signal 508c and to generate the control signal 508d for controlling one or more driver circuits in the power stage 510. The control signal 508d may be configured to adjust the power signal 502. Thus, the multi-mode power isolator system 500 may be configured to provide multi-mode feedback to the power stage 510 based on the power signal 502 received at the load circuit 530.

During operation of the multi-mode power isolator system 500, the power signal 502 is generated by one or more driver circuits in the power stage 510 and transmitted across the isolation barrier 12 via the transformer 520 to the load circuit 530. The power signal 502 is sensed in the load circuit 530 resulting in the output signal 506.

The output signal 506 is received by the feedback signal generator 540 and used to generate the PWM signal 508b via the error amplifier 546 and the PWM comparator 548b. The output signal 506 is fed to the error amplifier 446 along with the reference signal 542. The error amplifier 546, together with the resistor 544a and capacitors 544b and 544c, generates an error signal 508a to send to the PWM comparator 548b. The PWM comparator 548b compares the error signal 508a to the ramp wave 548a, and outputs the PWM signal 508b with duty cycle controlled by the error signal 508a. The PWM signal 508b is then passed to the digital isolator 550.

The digital isolator 550 may transmit the PWM signal 508b across the isolation barrier 12. In the illustrated embodiment, the PWM signal 508b is encoded using the encoder 552, sent via the transformer 554, and decoded using the decoder 556. The PWM signal 508b is then transmitted to the feedback controller 560.

The feedback controller 560 may generate the modulated signal 508c based on the PWM signal 508b, and may also generate the control signal 508d based on the modulated signal 508c to modify operation of the power stage 510. In the illustrated embodiment, the recovery circuit 562 outputs the voltage signal based on the duty cycle of the PWM signal

508*b*. For example, outputting the voltage signal above a voltage threshold level may indicate that the PWM signal 508*b* is at maximum duty cycle, and outputting the voltage signal below the voltage threshold level may indicate that the PWM signal 508*b* is not at maximum duty cycle. The voltage signal is then received by the control comparator 564*b* and the VCO 564*c*. The control comparator 564*b* compares the voltage signal with the control ramp 564*a* and outputs the result to the mixer 564*d* as a PWM control signal, which may have a duty cycle different from the duty cycle of the PWM signal 508*b*. Meanwhile, the VCO 564*c* selects either PWM mode or FM mode depending on whether the voltage signal is above or below the voltage threshold level. In PWM mode, the VCO 564*c* may generate a fixed high frequency boosting signal and output to the mixer 564*d*. In FM mode, the VCO may generate a variable high frequency boosting signal, with frequency controlled by the voltage signal, and output the boosting signal to the mixer 564*d*. The mixer 564*d* may accordingly combine the PWM control signal and the boosting signal to generate a high frequency PWM signal or a high frequency FM signal as the modulated signal 508*c*.

The modulated signal 508*c* is transmitted to the pre-driver circuit 566, which generates the control signal 508*d* accordingly to adjust the power signal 502 in the power stage 510. Thus, the multi-mode power isolator system 500 uses multi-mode feedback to control the power signal 502 based on the output signal 506 sensed at the load circuit 530.

Figure 6:
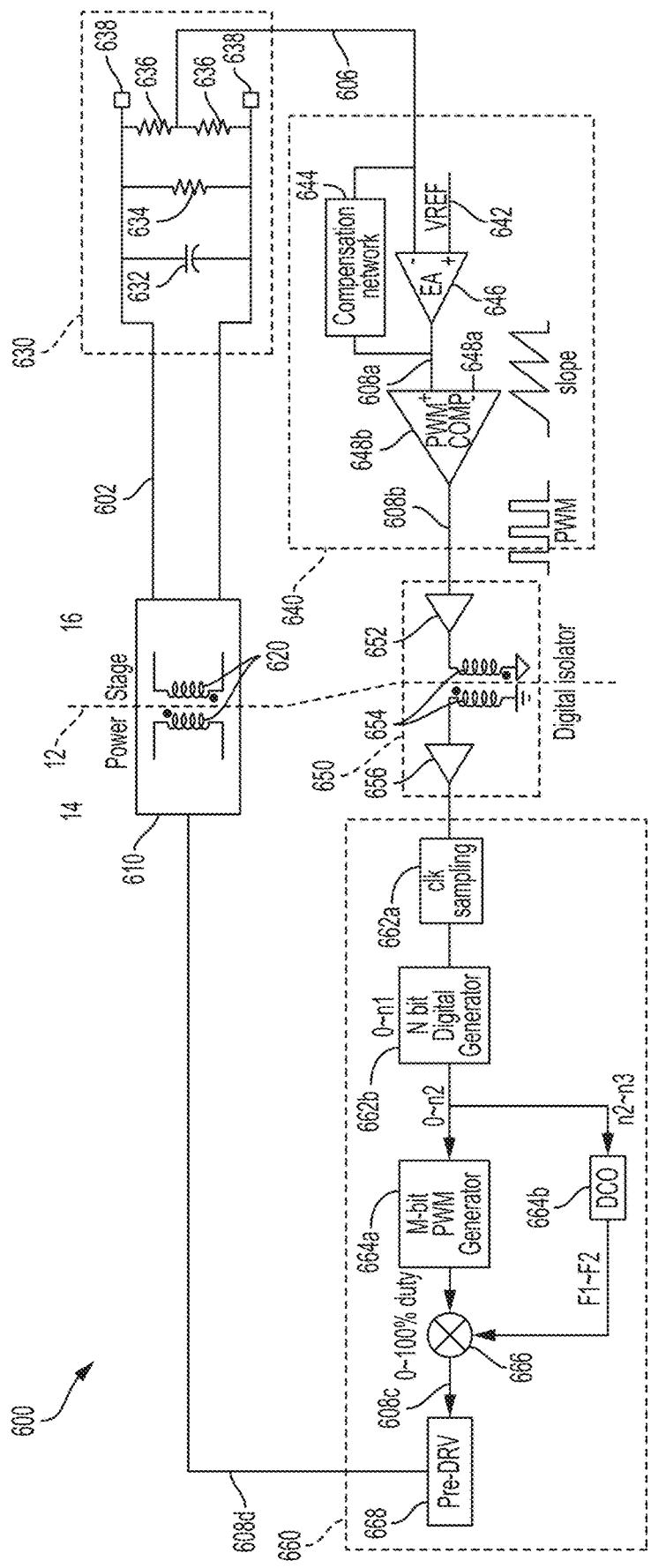
FIG. 6 illustrates an alternative multi-mode power isolator according to a non-limiting embodiment of the present application.

FIG. 6 illustrates a fourth non-limiting example of a circuit configuration for implementing a multi-mode power isolator system with multi-mode feedback control. In FIG. 6, selection of a feedback operating mode is performed using digital sampling and filtering components, followed by a PWM generator and DCO on the primary side 14 of the isolation barrier 12. The multi-mode power isolator system 600 comprises a power stage 610, a load circuit 630 representing a receiver, a feedback signal generator 640 and a feedback controller 660 in combination representing a feedback control circuit, and a digital feedback isolator 650. The feedback controller 660 is located on the primary side 14 of the isolation barrier 12, and the load circuit 630 and the feedback signal generator 640 are located on the secondary side 16 of the isolation barrier 12. The power stage 610 comprises a transformer 620 bridging the isolation barrier 12, and the feedback isolator 650 comprises a transformer 654 bridging the isolation barrier 12. The multi-mode power isolator system 600 is configured to operate in either PWM mode or FM mode.

The power stage 610 may be configured to generate and deliver a power signal 602 to the load circuit 630, which may be configured to sense the power signal 602 and generate a corresponding output signal 606. In the illustrated example, the power stage 610 operates in the manner previously described in connection with the power stage 310 as described in the first example, and the load circuit 630 operates in the manner previously described in connection with the load circuit 330. The load circuit 630 is connected to the feedback signal generator 640.

The feedback signal generator 640 may comprise an error amplifier 646 configured to generate an error signal 608*a* based on the output signal 606 and a reference signal 642, and a PWM comparator 648*b* configured to generate a PWM signal 608*b* based on the error signal 608*a* and a ramp wave 648*a*. A compensation network 644 may be connected between the output signal 606 and an output of the error amplifier 646. The output of the error amplifier 646 is configured to generate the error signal 608*a* based on a voltage difference between the output signal 606 and the reference signal 642. The reference signal 642 may be representative of the target voltage/current threshold level of the power signal 602. The output of the error amplifier 646 is connected to the PWM comparator 648*b*. The PWM comparator 648*b* is configured to receive the error signal 608*a* at a positive input terminal, and to receive the ramp wave 648*a* at a negative input terminal. An oscillator (not shown) may be connected to the negative input terminal and may be configured to generate the ramp wave 648*a* at a fixed frequency. The PWM comparator 648*b* is configured to generate the PWM signal 608*b* with a duty cycle that varies according to a voltage difference between the error signal 608*a* and the ramp wave 648*a*. The PWM comparator 648*b* is connected to the feedback isolator 650.

The feedback isolator 650 is configured to transmit the PWM signal 608*b* from the secondary side 16 of the isolation barrier 12 to the primary side 14 via the transformer 654. The feedback isolator 650 further comprises an encoder 652 configured to encode the PWM signal 608*b* on the secondary side 16 and a decoder 656 configured to decode the PWM signal 608*b* on the primary side 14. In the illustrated example, the feedback isolator 650 operates in the manner previously described in connection with the feedback isolator 350 of the first example. The feedback isolator 650 is connected to the feedback controller 660.

In the illustrated example, the feedback controller 660 is configured to receive the PWM signal 608*b* from the feedback isolator 650 via a clock sampling unit 662*a* and a digital duty cycle encoder 662*b*, to select either PWM mode or FM mode using a PWM generator 664*a* and a DCO 664*b* based on the received PWM signal 608*b*, and to generate a modulated signal 608*c* using a mixer 666 according to the selected PWM or FM mode. The feedback controller 660 is further configured to generate a control signal 608*d* using a pre-driver circuit 668 based on the modulated signal 608*c* for adjusting operation of the power stage 610. The clock sampling unit 662*a* may be configured to sample at a high frequency and the duty cycle encoder 662*b* may be configured to generate an encoding of the duty cycle (e.g. a high voltage peak count) such that the duty cycle of the sampled PWM signal 608*b* may be encoded digitally. For example, maximum duty may be measured in a peak count as it reaches a count threshold. It should be appreciated that other methods of encoding the duty cycle may be employed. The PWM generator 664*a* may be configured to receive the high voltage peak count or other digital encoding of the PWM signal 608*b* and to generate a corresponding duty cycle signal for PWM mode. For example, the PWM generator 664*a* may be configured to encode the duty cycle from the peak count into the duty cycle signal as a PWM signal. Alternatively, the PWM generator 664*a* may encode a duty cycle different from the duty cycle of the PWM signal 608*b* into the duty cycle signal. At maximum duty, the duty cycle signal may be a DC high voltage signal. The DCO 664*b* may also be configured to receive the high voltage peak count or other digital encoding of the PWM signal 608*b*, and may be further configured to generate a fixed frequency boosting signal for PWM mode or a variable frequency boosting signal for FM mode as a result. For example, the DCO 664*b* may be configured to compare the peak count to the count threshold to determine whether to operate in PWM mode or FM mode. However, more than two modes may be implemented, and thus the PWM generator 664*a* and DCO 664*b* may be configured to determine selection of mode using more than one high voltage peak count threshold. The PWM generator 664*a* and the DCO 664*b* are connected to the mixer 666 for generating the modulated signal 608c, which may be a combination of the duty cycle signal and the boosting signal.

The mixer 666 may be configured to generate the modulated signal 608c by combining the duty cycle signal output by the PWM generator 664a with the high frequency boosting signal output by the DCO 664b. The mixer 666 is connected to the pre-driver circuit 668. The pre-driver circuit 668 may comprise a switch configured to receive the modulated signal 608c and to generate the control signal 608d for controlling one or more driving circuits in the power stage 610. The control signal 608d may be configured to adjust the power signal 602. Thus, the multi-mode power isolator system 600 may be configured to provide multi-mode feedback to the power stage 610 based on the power signal 602 received at the load circuit 630.

During operation of the multi-mode power isolator system 600, the power signal 602 is generated by one or more amplifiers in the power stage 610 and transmitted across the isolation barrier 12 via the transformer 620 to the load circuit 630. The power signal 602 is sensed in the load circuit 630 resulting in the output signal 606.

The output signal 606 is received by the feedback signal generator 640 and used to generate the PWM signal 608b via the error amplifier 646 and the PWM comparator 648b. The output signal 606 is fed to the error amplifier 646 along with the reference signal 642. The error amplifier 646, together with the compensation network 644, generates an error signal 608a to send to the PWM comparator 648b. The PWM comparator 648b compares the error signal 608a to the ramp wave 648a, and outputs the PWM signal 608b with duty cycle controlled by the error signal 608a. The PWM signal 608b is then passed to the digital isolator 650.

The digital isolator 650 may transmit the PWM signal 608b across the isolation barrier 12. In the illustrated embodiment, the PWM signal 608b is encoded using the encoder 652, sent via the transformer 654, and decoded using the decoder 656. The PWM signal 608b is then transmitted to the feedback controller 660.

The feedback controller 660 may generate the modulated signal 608c based on the PWM signal 608b, and may also generate the control signal 608d based on the modulated signal 608c to modify operation of the power stage 610. In the illustrated embodiment, clock sampling unit 662a samples the PWM signal 608b at a high frequency. The clock frequency of the clock sampling unit 662a may be increased or decreased depending on a higher or lower desired resolution of the duty cycle to be encoded, with higher resolution generally attainable at higher clock frequencies. The duty cycle encoder 662b may generate the high voltage peak count as an encoding of the duty cycle of the sampled PWM signal 608b, and may transmit the high voltage peak count to the PWM generator 664a and the DCO 664b.

The PWM generator 664a may encode the duty cycle from the received peak count of the PWM signal 608b into the duty cycle signal to be sent to the mixer 666. Alternatively, a different duty cycle based on the received peak count may be encoded into the duty cycle signal. The DCO 664b may determine whether to operate in PWM mode or FM mode based on the high voltage peak count of the PWM signal 608b, and may transmit a boosting signal to the mixer 666 accordingly. For example, the high voltage peak count may be compared to a count threshold. If the count is below the count threshold, the PWM signal 608b may be below maximum duty and the DCO 664b may generate a fixed frequency boosting signal to be sent to the mixer 666 in accordance with PWM mode. If the count is above the count threshold, the PWM signal 608b may have reached maximum duty and the DCO 664b may generate a variable frequency boosting signal to be sent to the mixer 666 in accordance with FM mode. The frequency of the boosting signal may be controlled by the peak count in FM mode. However, more than two operating modes may be implemented, and thus multiple count thresholds may be employed. Count thresholds may alternatively be determined using a separate logic component, which may select an operating mode and direct operation of the PWM generator 664a and the DCO 664b accordingly.

The mixer 666 receives signals from the PWM generator 664a and the DCO 664b, and generates the resulting modulated signal 608c. The modulated signal 608c may have the duty cycle component generated by the PWM generator 664a and the high frequency component generated by the DCO 664b. Thus, in the illustrated example the modulated signal 608c may be a PWM or FM signal depending on the selected mode of operation. However, in some embodiments the modulated signal 608c may be a burst PWM mode signal. The modulated signal 608c is transmitted to the pre-driver circuit 666, which generates the control signal 608d accordingly to adjust the power signal 602 in the power stage 610. Thus, the multi-mode power isolator system 600 uses multi-mode feedback to control the power signal 602 based on the output signal 606 sensed at the load circuit 630.

Figure 7:
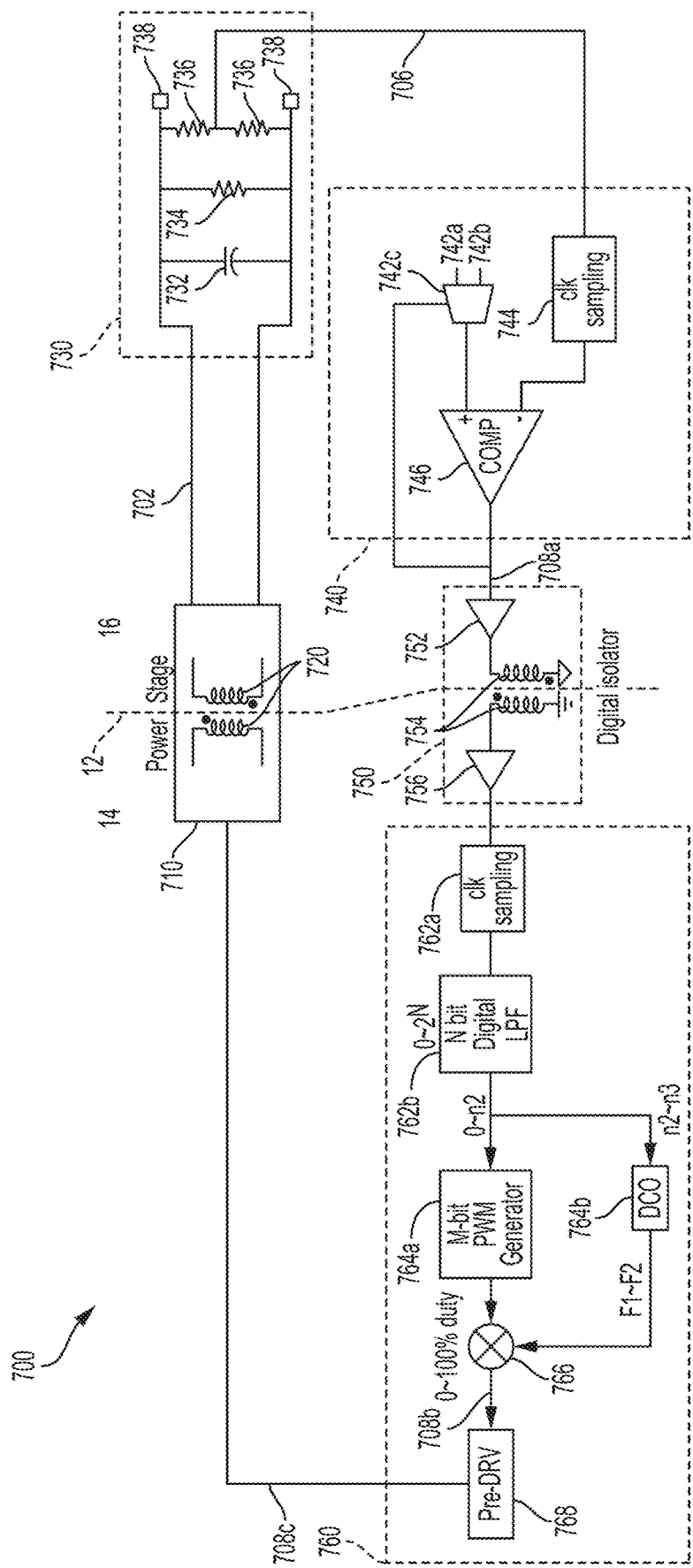
FIG. 7 illustrates an alternative multi-mode power isolator according to a non-limiting embodiment of the present application.

FIG. 7 illustrates a fifth non-limiting example of a circuit configuration for implementing a multi-mode power isolator system with multi-mode feedback control. In FIG. 7, feedback signals may be generated digitally on the secondary side 16 of the isolation barrier 12 without an error amplifier and using multiple reference signals (e.g., for maintaining the power signal between both upper and lower voltage/current threshold levels). The multi-mode power isolator system 700 comprises a power stage 710, a load circuit 730 representing a receiver, a feedback signal generator 740 and a feedback controller 760 in combination representing a feedback control circuit, and a digital feedback isolator 750. The feedback controller 760 is located on the primary side 14 of the isolation barrier 12, and the load circuit 730 and the feedback signal generator 740 are located on the secondary side 16 of the isolation barrier 12. The power stage 710 comprises a transformer 720 located at the isolation barrier 12, and the feedback isolator 750 comprises a transformer 754 located at the isolation barrier 12. The multi-mode power isolator system 700 is configured to operate in either PWM mode or FM mode.

The power stage 710 may be configured to generate and deliver a power signal 702 to the load circuit 730, which may be configured to sense the power signal 702 and generate a corresponding output signal 706. In the illustrated example, the power stage 710 operates in the manner previously described in connection with the power stage 310 as described in the first example, and the load circuit 730 operates in the manner previously described in connection with the load circuit 330. The load circuit 730 is connected to the feedback signal generator 640.

The feedback signal generator 740 comprises an output sampling unit 744, and a PWM comparator 746 configured to generate a PWM signal 708a based on the sampled output signal 706 and two possible reference signals 742a and 742b. The output sampling unit 744 may be configured to sample the output signal 706 so that the comparator 746 may be implemented digitally. Thus, the feedback signal generator 740 may be implemented entirely using digital components. However, analog components or a mix of digital and analog components may be used.

A reference unit 742c is configured to select one of the reference signals 742a and 742b to be compared to the output signal 706 in the comparator 746. For example, the multi-mode power isolator system 700 may be configured to maintain the power signal 702 between upper and lower target voltage threshold levels or target current threshold levels. Accordingly, the reference signals 742a and 742b may be configured as an upper reference signal and a lower reference signal or, more generally, first and second reference signals. Thus, the comparator 746 may be configured to compare the voltage or current level of the power signal 702 to the upper or lower of the reference signals 742a and 742b. The reference unit 742c is additionally connected to an output of the comparator 746 such that it may consider the output of the comparator 746 when selecting between the reference signals 742a and 742b. The comparator 746 is configured to generate the PWM signal 708a having a duty cycle based on the sampled output signal 706 and the reference signals 742a and 742b. The comparator 746 is connected to the feedback isolator 750.

The feedback isolator 750 is configured to transmit the PWM signal 708a from the secondary side 16 of the isolation barrier 12 to the primary side 14 via the transformer 754. The feedback isolator 750 further comprises an encoder 752 configured to encode the PWM signal 708a on the secondary side 16 and a decoder 756 configured to decode the PWM signal 708a on the primary side 14. In the illustrated example, the feedback isolator 750 operates in the manner previously described in connection with the feedback isolator 350 of the first example. The feedback isolator 750 is connected to the feedback controller 760.

In the illustrated example, the feedback controller 760 is configured to receive the PWM signal 708a from the feedback isolator 750 via a clock sampling unit 762a and a digital duty cycle encoder 762b, to select either PWM mode or FM mode using a PWM generator 764a and a DCO 764b based on the received PWM signal 708a, and to generate a modulated signal 708b using a mixer 766 according to the selected PWM or FM mode. The feedback controller 760 is further configured to generate a control signal 708c using a pre-driver circuit 768 based on the modulated signal 708b for adjusting operation of the power stage 710. The clock sampling unit 762a may be configured to sample at a high frequency and the duty cycle encoder 762b may be configured to generate an encoding of the duty cycle such as a high voltage peak count such that the duty cycle of the sampled PWM signal 708a may be encoded digitally. For example, a maximum duty may be measured in the peak count as the peak count reaches a count threshold. The PWM generator 764a may be configured to receive the high voltage peak count of the PWM signal 708a and to generate a duty cycle signal for PWM mode based on the received count. For example, the PWM generator 764a may encode the duty cycle from the count into the duty cycle signal as a PWM signal. Alternatively, the PWM generator 764a may encode a duty cycle different from the duty cycle of the PWM signal 708a. At maximum duty, the duty cycle signal may be a DC high voltage signal. The DCO 764b may also be configured to receive the high voltage peak count of the PWM signal 708a, and may be further configured to generate a fixed frequency boosting signal for PWM mode or a variable frequency boosting signal for FM mode depending on the count. For example, the DCO may be configured to compare the count to the count threshold to determine whether to operate in PWM mode or FM mode. In FM mode, the frequency of the boosting signal may be determined based on the peak count. However, more than two modes may be implemented, and thus the PWM generator 764a and DCO 764b may be configured to determine selection of mode using more than one high voltage peak count threshold. The PWM generator 764a and the DCO 764b are connected to the mixer 766 for generating the modulated signal 708b, which may be a combination of the duty cycle and the boosting signal.

The mixer 766 may be configured to generate the modulated signal 708b by combining the duty cycle signal output by the PWM generator 764a with the high frequency boosting signal output by the DCO 764b. The mixer 766 is connected to the pre-driver circuit 768. The pre-driver circuit 768 may comprise a switch configured to receive the modulated signal 708b and to generate the control signal 708c for controlling one or more driving circuits in the power stage 710. The control signal 708c may be configured to adjust the power signal 702. Thus, the multi-mode power isolator system 700 may be configured to provide multi-mode feedback to the power stage 710 based on the power signal 702 received at the load circuit 730.

During operation of the multi-mode power isolator system 700, the power signal 702 is generated by one or more driving circuits in the power stage 710 and transmitted across the isolation barrier 12 via the transformer 720 to the load circuit 730. The power signal 702 is sensed in the load circuit 730 resulting in the output signal 706.

The output signal 706 is received by the feedback signal generator 740 via the output sampling unit 744 and used to generate the PWM signal 708a via the comparator 746 compared to the reference signals 742a and 742b. The sampled output signal 706 is fed to the comparator 746 along with one of the reference signals 742a and 742b. The output of the comparator 746 is connected to the reference unit 742c and may be used in selecting one of the reference signals 742a and 742b. For example, the output signal 706 may be held between an upper bound set by the upper reference signal 742a and a lower bound set by the lower reference signal 742b. A first clock cycle may be used to compare the output signal 706 to the upper reference signal 742a to determine if the output signal 706 is above the upper bound. If the output of the comparator 746 indicates that the output signal 706 is higher than the upper bound, then the reference unit 742c may keep sending the upper reference signal 742a for several more clock cycles until the output signal 706 drops below the upper bound. If the output of the comparator 746 indicates that the output signal 706 is below the upper reference signal 742a, the reference unit 742c may send the lower reference signal 742b to determine if the output signal 706 is below the lower bound. If the output of the comparator 746 indicates that the output signal 706 is below the lower reference signal 742b, the reference unit 742c may continue to send the lower reference signal 742b until the output signal 706 rises above the lower bound. If the output signal 706 is detected to be between the upper reference signal 742a and the lower reference signal 742b (e.g. lower than the upper reference signal 742a and higher than the lower reference signal 742b), the reference unit 742c may alternate between sending the upper reference signal 742a and the lower reference signal 742b until an error is detected. The comparator 746 outputs the PWM signal 708a with duty cycle controlled by comparison between the output signal 706 and the reference signals 742a and 742b. For example, if both reference signals 742a and 742b are above the output signal 706, the duty cycle may be increased as compared to if only the upper reference signal 742b is above the output signal 706. This may be accomplished, for example, by dedicating part of each pulse width to the higher reference signal 742a and part of each pulse width to the lower reference signal 742b. Thus, the pulse width may be shorter or longer depending on where the output signal 706 is determined to be with regard to the upper and lower bounds. The PWM signal 708a is then passed to the digital isolator 750.

The digital isolator 750 may transmit the PWM signal 708a across the isolation barrier 12. In the illustrated embodiment, the PWM signal 708a is encoded using the encoder 752, sent via the transformer 754, and decoded using the decoder 756. The PWM signal 708a is then transmitted to the feedback controller 760.

The feedback controller 760 may generate the modulated signal 708b based on the PWM signal 708a, and may also generate the control signal 708c based on the modulated signal 708b to modify operation of the power stage 710. In the illustrated embodiment, clock sampling unit 762a samples the PWM signal 708a at a high frequency. The clock frequency of the clock sampling unit 762a may be increased or decreased depending on a higher or lower desired resolution of the duty cycle to be encoded, with higher resolution generally attainable at higher clock frequencies. The duty cycle encoder 762b may generate the high voltage peak count as an encoding of the duty cycle of the sampled PWM signal 708a, and may transmit the high voltage peak count to the PWM generator 764a and the DCO 764b.

The PWM generator 764a may encode the duty cycle from the received peak count of the PWM signal 708a into the duty cycle signal to be sent to the mixer 766. Alternatively, a duty cycle different from the received peak count may be encoded into the duty cycle signal. The DCO 764b may determine whether to operate in PWM mode or FM mode based on the high voltage peak count of the PWM signal 708a, and may transmit a boosting signal to the mixer 766 accordingly. For example, the high voltage peak count may be compared to a count threshold. If the count is below the count threshold, the PWM signal 708a may be below maximum duty and the DCO 764b may generate a fixed frequency boosting signal to be sent to the mixer 766 in accordance with PWM mode. If the count is above the count threshold, the PWM signal 708a may have reached maximum duty and the DCO 764b may generate a variable frequency boosting signal to be sent to the mixer 766 in accordance with FM mode. The frequency of the boosting signal may be controlled by the peak count. However, more than two operating modes may be implemented, and thus multiple count thresholds may be employed. Count thresholds may alternatively be determined using a separate logic component, which may select an operating mode and direct operation of the PWM generator 764a and the DCO 764b accordingly.

The mixer 766 receives signals from the PWM generator 764a and the DCO 764b, and generates the resulting modulated signal 708b. The modulated signal 708b may have the duty cycle generated by the PWM generator 764a and the frequency generated by the DCO 764b. Thus, in the illustrated example the modulated signal 708b may be a PWM or FM signal depending on the selected mode of operation. However, in some embodiments the modulated signal 708b may be a burst PWM mode signal. The modulated signal 708b is transmitted to the pre-driver circuit 766, which generates the control signal 708c accordingly to adjust the power signal 702 in the power stage 710. Thus, the multi-mode power isolator system 700 uses multi-mode feedback to control the power signal 702 based on the output signal 706 sensed at the load circuit 730.

Figure 8:
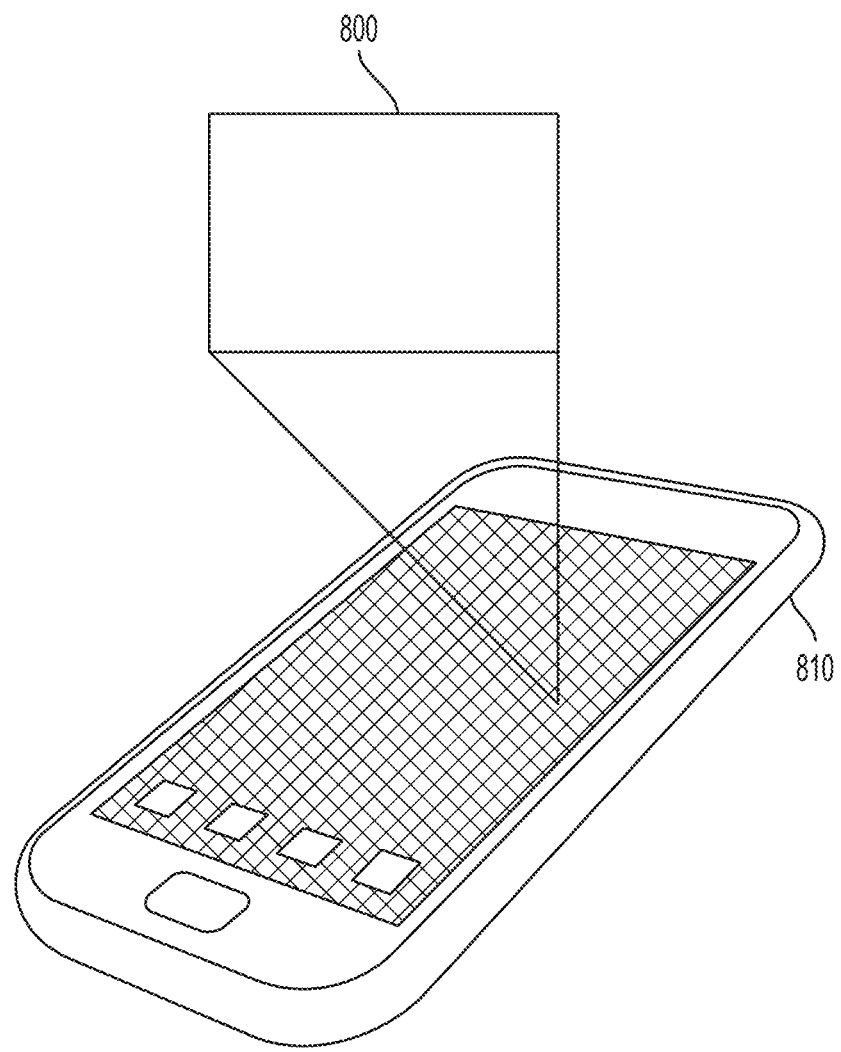
FIG. 8 illustrates a portable electronic device incorporating a multi-mode power isolator according to a non-limiting embodiment of the present application.

Multi-mode power isolators of the types described herein may be used in various devices and settings. For example, the multi-mode power isolators may be used for isolation in medical equipment systems, industrial equipment systems, physical measurement systems, or personal or portable electronic equipment. FIG. 8 is a schematic diagram showing a non-limiting application of a multi-mode power isolator system in a portable electronic device setting, according to some embodiments. A multi-mode power isolator system 800 may be used in a portable electronic device 810 to transmit power across an isolation barrier with both low EMI and high operating efficiency. The portable electronic device 810 may be a smartphone, personal digital assistant (PDA), tablet or other portable device. Other such devices may make use of multi-mode power isolator systems of the types described herein.

While FIG. 8 illustrates an example of a portable electronic device 810 incorporating aspects of the present application, other uses are possible. For example, one or more multi-mode power isolator systems 800 may be employed in an automobile or a medical instrument. Various embodiments of the present application may be implemented to provide multi-mode feedback control in a power isolator system.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An integrated multi-mode power isolator, comprising:
   an integrated circuit substrate;
   a driver circuit on the integrated circuit substrate;
   a receiver circuit on the integrated circuit substrate;
   a power transfer isolator configured to isolate the driver circuit from the receiver circuit and configured to transfer a power signal from the driver circuit to the receiver circuit;
   a digital feedback isolator coupling an output of the receiver circuit with an input of the driver circuit and configured to transfer a power control feedback signal from the receiver circuit to the driver circuit; and
   a feedback control circuit configured to detect an operating condition, select a feedback control mode from a plurality of selectable feedback control modes of the digital feedback isolator based on the operating condition, and provide the power control feedback signal corresponding to the selected feedback control mode across the digital feedback isolator,
   wherein the plurality of selectable feedback control modes of the digital feedback isolator are selected from the group consisting of:
      a pulse width modulation (PWM) mode;
      a pulse frequency modulation (PFM) mode;
      a frequency modulation (FM) mode; and
      a burst PWM mode.

2. The integrated multi-mode power isolator of claim 1, wherein the plurality of selectable feedback control modes includes the PWM mode and the FM mode, and wherein the feedback control circuit is configured to select the PWM mode in response to detecting a load below a threshold level and the FM mode in response to detecting a load above the threshold level.

3. The integrated multi-mode power isolator of claim 1, wherein the feedback control circuit comprises components on a first side and a second side of the digital feedback isolator.

4. The integrated multi-mode power isolator of claim 3, wherein the feedback control circuit comprises only analog circuitry on the first side of the digital feedback isolator and digital circuitry on the second side of the digital feedback isolator.

5. The integrated multi-mode power isolator of claim 3, wherein the feedback control circuit comprises digital circuitry on the first side and the second side of the digital feedback isolator.

6. The integrated multi-mode power isolator of claim 3, wherein the feedback control circuitry comprises up-conversion circuitry on a same side of the digital feedback isolator as the driver circuit, and wherein the up-conversion circuitry is configured to receive a feedback control signal of a first frequency and generate a feedback control signal of a second frequency that is higher than the first frequency.

7. The integrated multi-mode power isolator of claim 1, wherein the feedback control circuit is configured to compare an error signal with a ramp signal.

8. The digital feedback isolator of claim 1, wherein:
in the PWM mode, the power control feedback signal comprises a first plurality of pulses, each pulse comprising:
a pulse width based on the operating condition; and
a first plurality of sub-pulses of a same frequency; and
in the FM mode, the power control feedback signal comprises a second plurality of pulses, each pulse comprising:
a same pulse width; and
a second plurality of sub-pulses having a frequency based on the operating condition.

9. An integrated multiple-feedback-mode power isolator, comprising:
a transmitter, receiver, and power transfer isolator separating the transmitter and receiver, wherein the transmitter is configured to transmit a power signal to the receiver across the power transfer isolator;
a digital feedback isolator integrated with the power transfer isolator; and
a feedback control circuit configured to detect an operating condition of the multiple-feedback-mode power isolator, select a feedback control mode from among a plurality of feedback control modes based on the operating condition, and transfer a power control feedback signal corresponding to the selected feedback control mode across the digital feedback isolator,
wherein the plurality of feedback control modes are selected from the group consisting of:
a pulse width modulation (PWM) mode;
a pulse frequency modulation (PFM) mode;
a frequency modulation (FM) mode; and
a burst PWM mode.

10. The integrated multiple-feedback-mode power isolator of claim 9, wherein the plurality of feedback control modes includes the PWM and the FM mode, and wherein the feedback control circuit is configured to select the PWM mode in response to detecting a load condition below a threshold level and the FM mode in response to detecting a load condition above the threshold level.

11. The integrated multiple-feedback-mode power isolator of claim 9, wherein the feedback control circuit comprises components on a first side and a second side of the digital feedback isolator.

12. The integrated multiple-feedback-mode power isolator of claim 11, wherein the feedback control circuit comprises only analog circuitry on the first side of the digital feedback isolator and digital circuitry on the second side of the digital feedback isolator.

13. The integrated multiple-feedback-mode power isolator of claim 11, wherein the feedback control circuit comprises digital circuitry on the first and second sides of the digital feedback isolator.

14. The integrated multiple-feedback-mode power isolator of claim 11, wherein the transmitter is on the first side of the digital feedback isolator, and wherein the feedback control circuitry comprises up-conversion circuitry on the first side of the digital feedback isolator, and wherein the up-conversion circuitry is configured to receive a feedback control signal of a first frequency and generate a feedback control signal of a second frequency that is higher than the first frequency.

15. The integrated multiple-feedback-mode power isolator of claim 9, wherein the feedback control circuit is configured to compare an error signal with a ramp signal.

16. The integrated multiple-feedback-mode power isolator of claim 9, wherein:
in the PWM mode, the power control feedback signal comprises a first plurality of pulses, each pulse comprising:
a pulse width based on the operating condition; and
a first plurality of sub-pulses of a same frequency; and
in the FM mode, the power control feedback signal comprises a second plurality of pulses, each pulse comprising:
a same pulse width; and
a second plurality of sub-pulses having a frequency based on the operating condition.

17. An integrated power isolator with multi-modal feedback control, comprising:
a power transfer isolator;
a feedback control isolator; and
means for:
detecting an operating condition;
selecting a feedback control mode from among a plurality of feedback control modes based on the operating condition; and
transferring a power control feedback signal corresponding to the selected feedback control mode across the feedback control isolator,
wherein the plurality of selectable feedback control modes are selected from the group consisting of:
a pulse width modulation (PWM) mode;
a pulse frequency modulation (PFM) mode;
a frequency modulation (FM) mode; and
a burst PWM mode.

18. The integrated power isolator with multi-modal feedback control of claim 17, wherein the means for selecting a feedback control mode from among a plurality of feedback control modes based on the operating condition comprises means for switching between the PWM mode and the FM mode.

19. The integrated power isolator with multi-modal feedback control of claim 17, wherein the operating condition is a load condition of the integrated power isolator, and wherein the means for selecting a feedback control mode from among a plurality of feedback control modes based on the operating condition comprises means for automatically switching between the PWM mode and the FM mode based on the load condition.

20. The integrated power isolator with multi-modal feedback control of claim 17, wherein the means for transferring a power control feedback signal corresponding to the selected feedback control mode across the feedback control isolator comprises means for transferring a PWM signal across the feedback control isolator and increasing a frequency of the PWM signal.

* * * * *